(12) United States Patent
Moss

(10) Patent No.: US 7,826,216 B2
(45) Date of Patent: Nov. 2, 2010

(54) INFORMATION HANDLING CENTER COOLING SYSTEM

(75) Inventor: David Lyle Moss, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 69 days.

(21) Appl. No.: 12/326,992

(22) Filed: Dec. 3, 2008

(65) Prior Publication Data

US 2010/0134972 A1    Jun. 3, 2010

Related U.S. Application Data

(63) Continuation-in-part of application No. 12/247,513, filed on Oct. 8, 2008.

(51) Int. Cl.
  *H05K 7/20* (2006.01)
  *F28F 7/00* (2006.01)
(52) U.S. Cl. .................... 361/679.49; 361/679.53; 361/679.48; 361/679.5; 361/690; 361/694; 361/695
(58) Field of Classification Search ............ 361/679.53, 361/679.48, 679.49, 679.5, 690, 694, 695; 165/80.2
  See application file for complete search history.

(56) References Cited

U.S. PATENT DOCUMENTS

| | | | |
|---|---|---|---|
| 6,747,872 B1 * | 6/2004 | Patel et al. ................... | 361/695 |
| 6,775,977 B2 | 8/2004 | Stein | |
| 6,868,682 B2 * | 3/2005 | Sharma et al. ................ | 62/180 |
| 7,209,351 B2 * | 4/2007 | Wei ............................ | 361/695 |
| 7,500,911 B2 * | 3/2009 | Johnson et al. ............. | 454/184 |
| 7,542,287 B2 * | 6/2009 | Lewis et al. .................. | 361/695 |
| 7,643,291 B2 * | 1/2010 | Mallia et al. ................ | 361/695 |
| 2003/0053293 A1 * | 3/2003 | Beitelmal et al. ........... | 361/687 |
| 2003/0067745 A1 * | 4/2003 | Patel et al. ................... | 361/690 |
| 2004/0065097 A1 * | 4/2004 | Bash et al. ................... | 62/180 |
| 2004/0090729 A1 * | 5/2004 | Beitelmal et al. ........... | 361/103 |
| 2004/0100770 A1 * | 5/2004 | Chu et al. .................... | 361/698 |
| 2004/0217072 A1 * | 11/2004 | Bash et al. ..................... | 211/26 |
| 2005/0237716 A1 * | 10/2005 | Chu et al. .................... | 361/696 |
| 2005/0278069 A1 * | 12/2005 | Bash et al. ................... | 700/276 |
| 2006/0168975 A1 * | 8/2006 | Malone et al. ................ | 62/180 |
| 2006/0199508 A1 * | 9/2006 | Nair et al. .................... | 454/237 |
| 2008/0055846 A1 * | 3/2008 | Clidaras et al. .............. | 361/687 |
| 2008/0266794 A1 * | 10/2008 | Malone ....................... | 361/695 |
| 2009/0056910 A1 * | 3/2009 | Mallia et al. ................ | 165/80.3 |
| 2009/0059523 A1 * | 3/2009 | Mallia et al. ................ | 361/695 |

* cited by examiner

*Primary Examiner*—Anatoly Vortman
(74) *Attorney, Agent, or Firm*—Haynes and Boone, LLP

(57) ABSTRACT

An information handling center includes an information handling system (IHS) rack configured to receive cooled fluid from a pressurized plenum. The IHS rack includes at least one ventilator that is operable to cause cooled fluid to be drawn from the pressurized plenum into the IHS rack. A cooling fluid supply unit is coupled to the pressurized plenum and operable to cool a fluid passing through the cooling fluid supply unit and direct that cooled fluid into the pressurized plenum. A fluid flow control is located in the cooling fluid supply unit and coupled to a pressure sensor that is operable to determine a pressure in the pressurized plenum. The fluid flow control is operable to adjust the flow rate of the fluid passing through the cooling fluid supply unit based on the pressure determined by the pressure sensor. In response to the pressure sensor determining a pressure change in the pressurized plenum, the fluid flow control adjusts the flow rate of the fluid passing through the cooling fluid supply unit to adjust the pressure in the pressurized plenum.

14 Claims, 17 Drawing Sheets

INFORMATION HANDLING CENTER COOLING SYSTEM

CROSS REFERENCE TO RELATED APPLICATION

This disclosure is a continuation-in-part of U.S. patent application Ser. No. 12/247,513, filed on Oct. 8, 2008, and entitled Temperature Control For An Information Handling System Rack, the disclosure of which is incorporated herein by reference.

BACKGROUND

The present disclosure relates in general to information handling systems, and more particularly to systems and methods for cooling an information handling center that includes a plurality of information handling systems.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

A group of one or more IHSs may form an information handling center. An information handling center can occupy one room of a building, one floor, or an entire building, for example. An information handling center may include, for example, a number of servers racked up into 19 inch rack cabinets, often placed in single rows forming corridors between them, which allows human access to the front and rear of each cabinet. Servers differ greatly in size from 1U servers to very large storage silos. Some equipment such as mainframe computers and storage devices are often as big as the racks themselves.

A 19-inch rack is a standardized system for mounting various electronic modules in a "stack," or rack that is 19 inches (482.6 mm) wide. Equipment designed to be placed in a rack is typically described as rack-mount, a rack mounted system, a rack mount chassis, subrack, rack mountable, or simply shelf. This standard rack arrangement is widely used throughout the telecommunication, computing, audio, entertainment and other industries.

The physical environment of an information handling center is typically under strict control, especially the temperature within the information handling center. Air conditioning is typically used to control the temperature and humidity in the information handling center. For example, a temperature range of 20-25° C. and humidity range of 40-60% is typically suitable for information handling center conditions. The electrical power used by the electronic equipment is converted to heat, which is transferred to the ambient air in the space near the electronic equipment. Unless the heat is removed, the ambient temperature will rise, which may result in electronic equipment malfunction. By controlling the air temperature of the space, the electronic components may be kept within the manufacturer's specified temperature/humidity range. Air conditioning systems may help control space humidity within acceptable parameters by cooling the return space air below the dew point. A raised floor may be used in order to distribute cooled air within an information handling center.

Information handling centers are typically equipped with a raised floor with vent tiles configured to provide cool air to the IHSs (e.g., racks) from a pressurized plenum in the space below the raised floor. One system for cooling racks has been suggested before in U.S. Patent Publication No. 2005/0237716 A1, "Air Flow System and Method for Facilitating Cooling of Stacked Electronics Components" where an airflow plenum is added to either and/or the front and rear of a rack. In the case where the plenum is added to the front of the rack, it picks up air from a tile supplying cool air immediately in front of the rack.

These vent tiles are typically unable to vary the airflow dynamically to the information handling center. In addition, the vent tiles typically operate without knowledge of how each vent tile affects IHSs in its proximity. This may have unintended consequences, e.g., inadequate airflow delivery to the racks and/or wasted energy consumption, which may lead to inefficiencies in both cooling of the IHSs as well as in the operations of air conditioning units.

It is desirable to distribute air having a controlled temperature to IHSs, such as for example racks. This may avoid too high or too low ambient air temperatures of a rack. Reducing or minimizing chilled air consumption is beneficial, e.g., to lower operating costs of an information handling center. In addition, reducing the total flow of air in a raised floor and/or air conditioned room may lower running costs.

Reduce airflow consumption in rack products, especially servers, is typically desirable, as facility electricity devoted to cooling can be substantial. In a typical chilled water facility, for example, where large air handling units (AHU) pressurize a raised floor, energy is used by the AHU to transport chilled air to the server and heated air back from the server. Energy is also used remotely at the chiller plant to chill water for use around the facility, at the outside condenser for ultimate heat rejection, and for transporting fluid (generally water) to and from the chiller and condenser. As the AHU uses energy to move air, it also adds heat to the facility which must also be removed through the chiller and condenser. The open raised floor environment is often accompanied by a large over-provisioning of AHUs due to poor and unpredictable airflow dynamics that create hot spots. Many data centers end up over-provisioning to cool these hot spots and/or spend much more energy than needed in chilling the air to temperatures lower than necessary.

SUMMARY

According to one embodiment, an information handling center includes an IHS rack configured to receive cooled fluid from a pressurized plenum, wherein the IHS rack includes at least one ventilator that is operable to cause cooled fluid to be drawn from the pressurized plenum into the IHS rack, a cooling fluid supply unit coupled to the pressurized plenum and operable to cool a fluid passing through the cooling fluid supply unit and direct that cooled fluid into the pressurized plenum, a fluid flow control located in the cooling fluid supply unit and coupled to a pressure sensor that is operable to determine a pressure in the pressurized plenum, wherein the fluid flow control is operable to adjust the flow rate of the fluid passing through the cooling fluid supply unit based on the pressure determined by the pressure sensor, and wherein in response to the pressure sensor determining a pressure change in the pressurized plenum, the fluid flow control adjusts the flow rate of the fluid passing through the cooling fluid supply unit to adjust the pressure in the pressurized plenum.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
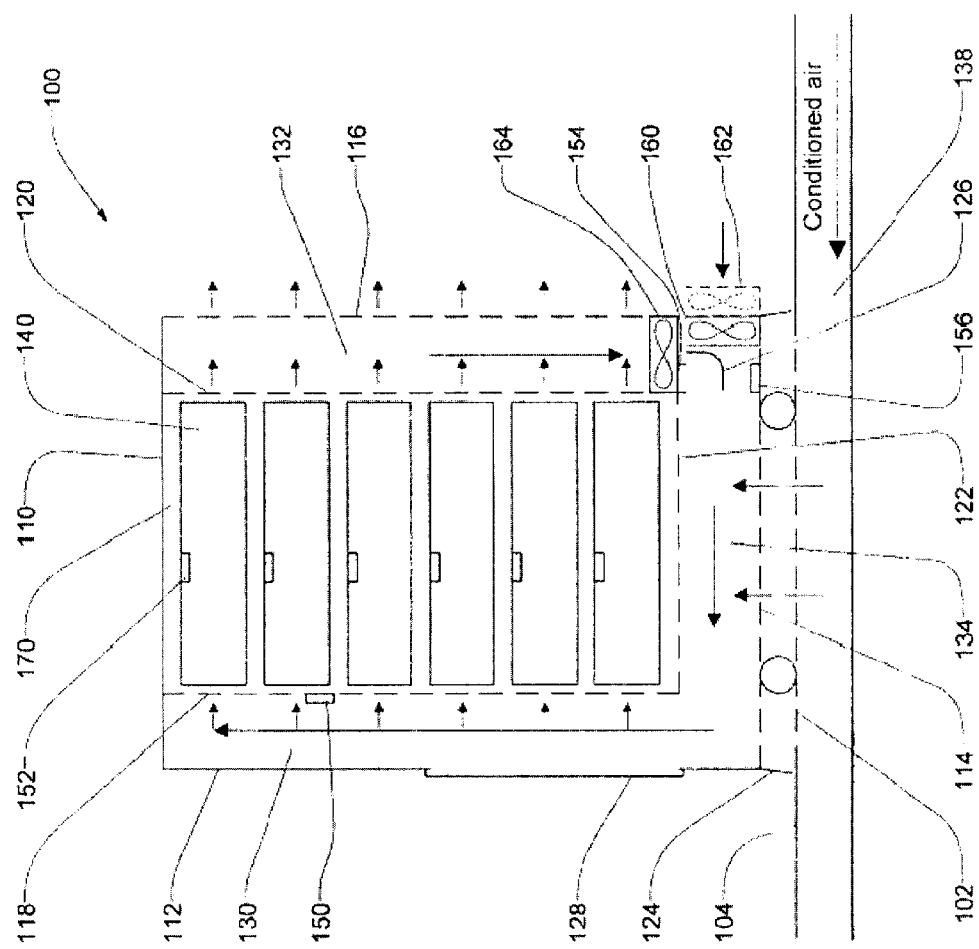
FIG. 1 is a schematic view illustrating an embodiment of a system for cooling an IHS rack (e.g., a server rack).
Figure 2:
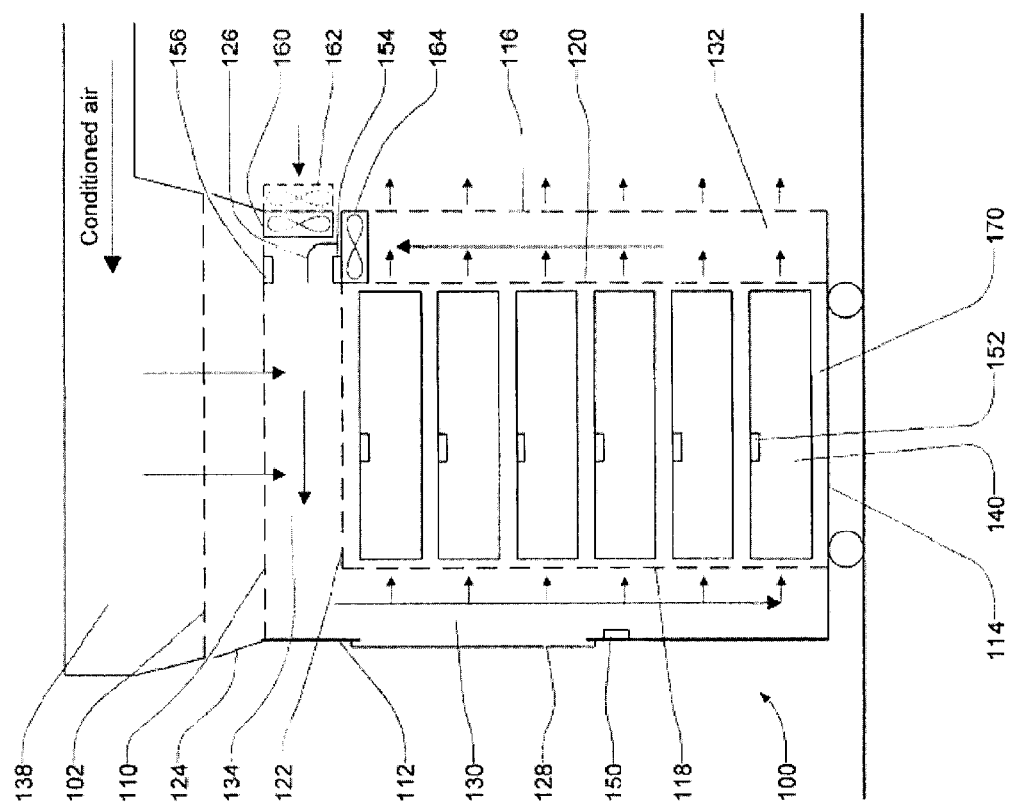
FIG. 2 is a schematic view illustrating an embodiment of a system for cooling an IHS rack (e.g., a server rack).

FIGS. 1 and 2 illustrate two example embodiments of a system for cooling an IHS rack (e.g., a server rack), according to certain embodiments of the present disclosure. The example embodiments in FIGS. 1 and 2 generally resemble each other and have similar technical features. The main difference is that cooling air is supplied from below in the embodiment illustrated by FIG. 1, while cooling air is supplied from above in the embodiment illustrated by FIG. 2. Like reference numbers are used to indicate like and corresponding parts in FIGS. 1 and 2.

FIG. 1 illustrates an example embodiment of a system 100A, for example an IHS in the form of a rack 170 (e.g., a server rack). A data center may for example include one or more such systems 100A. The system 100A may include a top side 110, a front side 112, a bottom side 114, and a rear side 116. Further, the system may include a front rack side 118, a back rack side 120, and a connecting rack side 122.

The front rack side 118, the back rack side 120, the top side 110, and the connecting rack side 122 may be connected to each other and form a rack 170 for one or more rack units 140. The top side 110, the front side 112, the bottom side 114, and the rear side 116 may be connected to each other and form the outer sides of the system 100A.

A front plenum 130 may be formed between the front side 112 and the front rack side 118. The front plenum 130 may be configured to transport air throughout the entire height of the rack 170. A back plenum 132 may be formed between the back side 116 and the back rack side 120. The back plenum 132 may be configured to transport air throughout the entire height of the rack 170. A connecting plenum 134 may be formed between the connecting rack side 122 and the bottom side 114. The connecting plenum 134 may connect the front plenum 130 and the back plenum 132, for example at 90 degree connections, and may be configured to transport air from the back plenum 132 to the front plenum 130. In the specific example illustrated by FIG. 1, the connecting plenum 134 is located at the bottom of the system 100A.

FIG. 1 illustrates six rack units 140 within the rack 170 as an example, but any suitable numbers of rack units may be placed in the rack 170. The rack units 140 may or may not include sensors 152, e.g., temperature sensors. One or more sensors may be placed within a rack unit 140, such as for example a temperature sensor 152 included in the rack unit 140 for sensing the temperature of components within the rack unit 140. A sensor dedicated to the rack unit 140 may indicate air temperature of the air flow through the rack 170.

The front rack side 118, the back rack side 120, and the connecting rack side 122 may allow air to pass through them, for example by including one or more openings allowing air flow, e.g., as shown in FIG. 1. Similarly, the bottom side 114 and the rear side 116 may allow air to pass through them, for example by including one or more openings allowing air flow, e.g., as shown in FIG. 1. Thus, cool air for cooling the rack 170 may enter through the bottom side 114 into the connecting plenum 134. From the connecting plenum 134 the air may move to the front plenum 130 and continue into the rack 170, as indicated by arrows in FIG. 1. From the connecting plenum 134 the air may also move directly into the rack 170 via openings in the connecting rack side 122, as indicated by arrows in FIG. 1. The cooling air cools the rack 170 and its rack units 140. The air flowing through rack 170 may be heated by warm rack units 140 and the heated air may move into the back plenum 132 and out from the rack 170 through openings in rear side 116 into the space surrounding the system 100A, as indicated by arrows in FIG. 1.

One or more ventilators 160, 162, 164 may be used for moving air to the connecting plenum 134. In one embodiment, a ventilator 160 may be located on the inside of the system 100A, for example inside the connecting plenum 134. The ventilator 160 may move air from outside the system 100A in to the connecting plenum 134. Alternatively, or additionally, a ventilator 162 may be located on the outside of the system 100A for moving air from outside the system 100A in to the connecting plenum 134. Alternatively, or additionally, a ventilator 164 may be located in the air flow between the back plenum 132 and the connecting plenum 134 for moving air from the back plenum 132 into the connecting plenum 134. In this manner, warmer air may be moved into the connecting plenum 134 and mixed with the cooling air for the rack 170. This may reduce the amount of cool air used for cooling the rack 170.

The one or more ventilators 160, 162, 164 may include, e.g., powered fans, actuated vents, a combination of both, or any other device for generating or promoting an air flow. In the case of a powered fan, the level of air flow generated by the fan may be controlled by controlling the rotational speed of the fan. Tables may indicate the amount of air moved by a fan at a specific rotational speed. In the case of an actuated vent, the air flow may be regulated by incrementally opening and closing the vent by an actuator. To ensure that the air flows in the right direction, the vents may be configured to only allow air to pass through in one direction, for example from the back plenum 132 to the connecting plenum 134.

Sensors 150, 152, 154, 156 may be provided for sensing the temperature of the air within the system 100A. These sensors may be one or more discrete rack sensors 150, 154, 156, or one or more sensors 152 of a rack unit 140 disposed in the rack 170, or a combination of both. The sensors may indicate the temperature of the air flow within different parts of the system 100A.

The temperature of the air flowing into the rack 170, namely the temperature of the air flow in the front plenum 130, may represent important control data. Thus, at least one sensor 150 may be placed within the front plenum 130. The location of the sensor 150 illustrated in FIG. 1 is only an example and any suitable location within the front plenum 130 may be used.

The temperature of the cool air that flows into the connecting plenum 134 may also represent important control data. Thus, at least one sensor 156 may be placed within the connecting plenum 134. The location of the sensor 156 illustrated in FIG. 1 is only an example and any suitable location within the connecting plenum 134 may be used.

The temperature of the air that flows out of the rack 170 or within the back plenum 133 may also represent important control data because this air flow is mixed with the cooling air flow in the connecting plenum 134. Thus, the temperatures of the two air flows mixing in the connecting plenum may be determined. Thus, at least one sensor 154 may be placed within the connecting plenum 134 or the back plenum 132. The location of the sensor 154 illustrated in FIG. 1 is only an example and any suitable location within the connecting plenum 134 or back plenum 132 may be used.

The system 100A may further include guide element 126, for example a turning vane or other structure, for guiding air from the back plenum 132 into the connecting plenum 134. The guide element 126 may be configured to separate, in the vicinity of at least one of the sensors 154, 156, warmer air from the back plenum 132 from cooler air entering the connecting plenum 134 from outside the rack 170. In this way the temperature sensor 154 may accurately measure the temperature of the air flow moved by the ventilator 164, and the temperature sensor 156 may accurately measure the temperature of the incoming cooling air, without cross-interference between the two air flow. In other words, the warmer air measurement is separated from the cool air measurement. The example guide element 126 in FIG. 1 is L-shaped. However, this is only one example; any suitable shape (e.g., planar, curved, etc.) and/or orientation of a guide element for guiding the air flow in the connecting plenum 134 may be used.

The system 100A may be placed in any suitable space, such as for example a computer center, room, or similar. The space may be equipped with a raised floor 104 with vent tiles 102 configured to provide cool air to IHSs, such as racks 170, from a pressurized plenum 138 in the space below the raised floor 104.

In embodiments in which the connecting plenum 134 is a lower plenum (e.g., the embodiment of FIG. 1), the system 100A may be connectable to a floor plenum 138 with cool air by means of a skirt 124. The skirt 124 may include rubber, brushes, or any other suitable material for guiding the cool air from the floor plenum 138 to the lower plenum 134. Preferably, the skirt 124 may be of a compliant material for rack transport.

In one embodiment, the front side 112 may be, or may include, a front door. The front door 112 may be solid and include a front access panel 128 configured to allow at least partial access to the rack 170. The access panel 128 may for example be a sliding or hinged door that substantially preserves the integrity of the front plenum 130 when the front door 112 is closed, to reduce or minimize any disturbances to the internal air flow of the system 100A, which may reduce the necessary amount of cool air for cooling the rack.

FIG. 2 illustrates another example system 100B, in accordance with certain embodiments of the present disclosure. System 100B resembles system 100A of FIG. 1, except in system 100A the cool air for cooling the rack is supplied from the floor, while in system 100B the cool air is supplied from above, e.g., from the ceiling. Like reference numbers are used to indicate like and corresponding parts between the example embodiments shown in FIGS. 1 and 2.

The front rack side 118, the back rack side 120, and the connecting rack side 122 may allow air to pass through, e.g., by including one or more openings. The top side 110 and the rear side 116 may also allow air to pass through, e.g., by including one or more openings. Thus, cool air for cooling the rack 170 may enter through the top side 110 into the connecting plenum 134, as indicated by arrows in FIG. 2. From the connecting plenum 134 the air may move to the front plenum 130 and continue into the rack 170, as indicated by arrows in FIG. 2. From the connecting plenum 134 the air may also move directly into the rack 170 via the connecting rack side 122, as indicated by an arrow in FIG. 2. The cooling air cools the rack 170 and its units 140. The air passing through rack 170 may be heated by warm rack units 140 and the heated air may move into the back plenum 132 and out from the rack 170 through openings in read side 116, as indicated by arrows in FIG. 2.

The space in which the system 100B may be placed may be equipped with an overhead cool air supply system. Such a system may include, e.g., a ceiling plenum with vent 102 configured to provide cool air to IHSs, such as racks 170.

In embodiments in which the connecting plenum 134 is an upper plenum, e.g., as illustrated in FIG. 2, the system 100B may be connectable to a ceiling plenum 138 providing cool air. Depending on the existing ceiling plenum, this connection may be facilitated by means of a skirt 124. The skirt 124 may include rubber, brushes, or any other suitable material for guiding the cool air from the ceiling plenum 138 to the upper plenum 134.

Further, the shape and/or orientation of the guide element 126 in FIG. 2 for guiding air from the back plenum 132 into the connecting plenum 134 may differ from the shape and/or orientation of the guide element 126 in FIG. 1. For example, the guide element 126 shown in FIG. 2 is L-shaped, but arranged in a different orientation than the guide element 126 in the embodiment of FIG. 1. However, this is only one example; any suitable shape (e.g., planar, curved, etc.) and/or orientation a guide element for guiding the air flow in the connecting plenum 134 may be used.

The guide element 126 may be configured to separate, in the vicinity of at least one of the sensors 154, 156, warmer air from the back plenum 132 from cooler air entering the connecting plenum 134 from outside the rack 170. In this way the temperature sensor 154 may accurately measure the temperature of the air flow moved by the ventilator 164, and the temperature sensor 156 may accurately measure the temperature of the incoming cooling air, without cross-interference between the two air flow. In other words, the warmer air measurement is separated from the cool air measurement.

According to other embodiments, the space in which system 100 is placed may be an air-conditioned room. In such embodiments, cool air may not be supplied from specific plenums from above or below; instead, cool air surrounds the system 100 and may for example enter the system 100 through the aid of ventilators 160 or 162. Cool air may enter the connecting plenum 134 and, depending on the sensed temperature, the heated air by the rack 170 may be mixed with the cool air.

Figure 3:
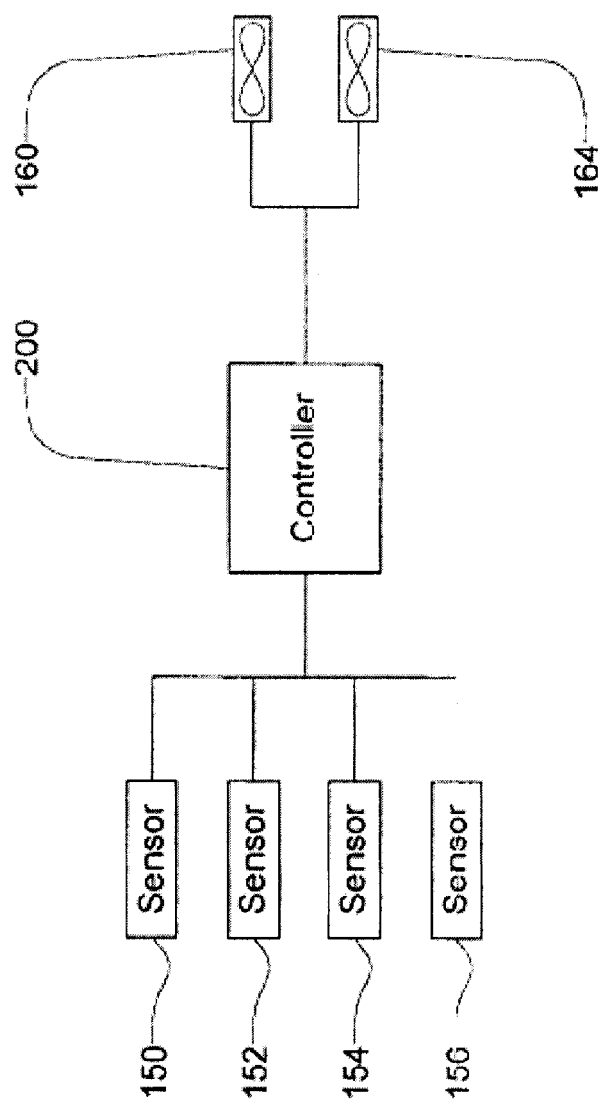
FIG. 3 is a schematic view illustrating an embodiment of a configuration for controlling ventilators of the cooling system of FIG. 1 or 2.

FIG. 3 illustrates an example configuration for controlling ventilators according to certain embodiments of the present disclosure, which may, for example, be used in connection with any of the embodiments shown in FIG. 1 or 2. At least one of the sensors 150, 152, 154, 156 may be connected to a controller 200, which in may be is connected to at least one ventilator 160, 164. As disclosed above, the rack 170 may include one or more sensors 152 within each rack unit 140.

The temperature readings of the sensors 150, 152, 154, 156 may be processed by the controller 200 to control the at least one ventilator 160, 162, 164. For example, in the case of a fan, the controller 200 may increase, decrease or stop the fan based on the temperature readings. As another example, in the case of an actuated vent, the controller 200 may open or close the vent fully or partially.

According to some embodiments, a front plenum extension is added to an otherwise standard rack. The front plenum is configured to a depth capable of transporting air throughout the entire height of the rack. The extended front door may be solid such that air delivered to the rack travels vertically, parallel to the front door. Vent tiles may be placed below the rack such that the entire underside of the rack accepts cooling air from a raised floor plenum. A connecting rack plenum may be formed, likely to decrease the useable rack space. The connecting plenum may deliver air to the front plenum.

The connecting plenum (lower plenum) may be fairly tightly coupled to the raised floor by an extension, a skirt, of the rack extending to the floor (in the area of the casters). This skirt may include a compliant material for transport. Material examples may include brush or rubber where the material is reasonably impervious to air but compliant enough for rack transport.

At least one mixing ventilator, such as for example a fan, may be added to the rear of the rack. In operation, the effect of the mixing ventilator is to inject warm IT exhaust into the connecting plenum. Mixed with the cool air from the raised floor, this controlled injection of warm air enables a targeted delivery temperature for the front plenum. A control mechanism adjusts the ventilators based on an inlet temperature sensor or average of several sensors. The sensors may be discrete rack sensors or sensors built into a specified server(s).

Figure 4:
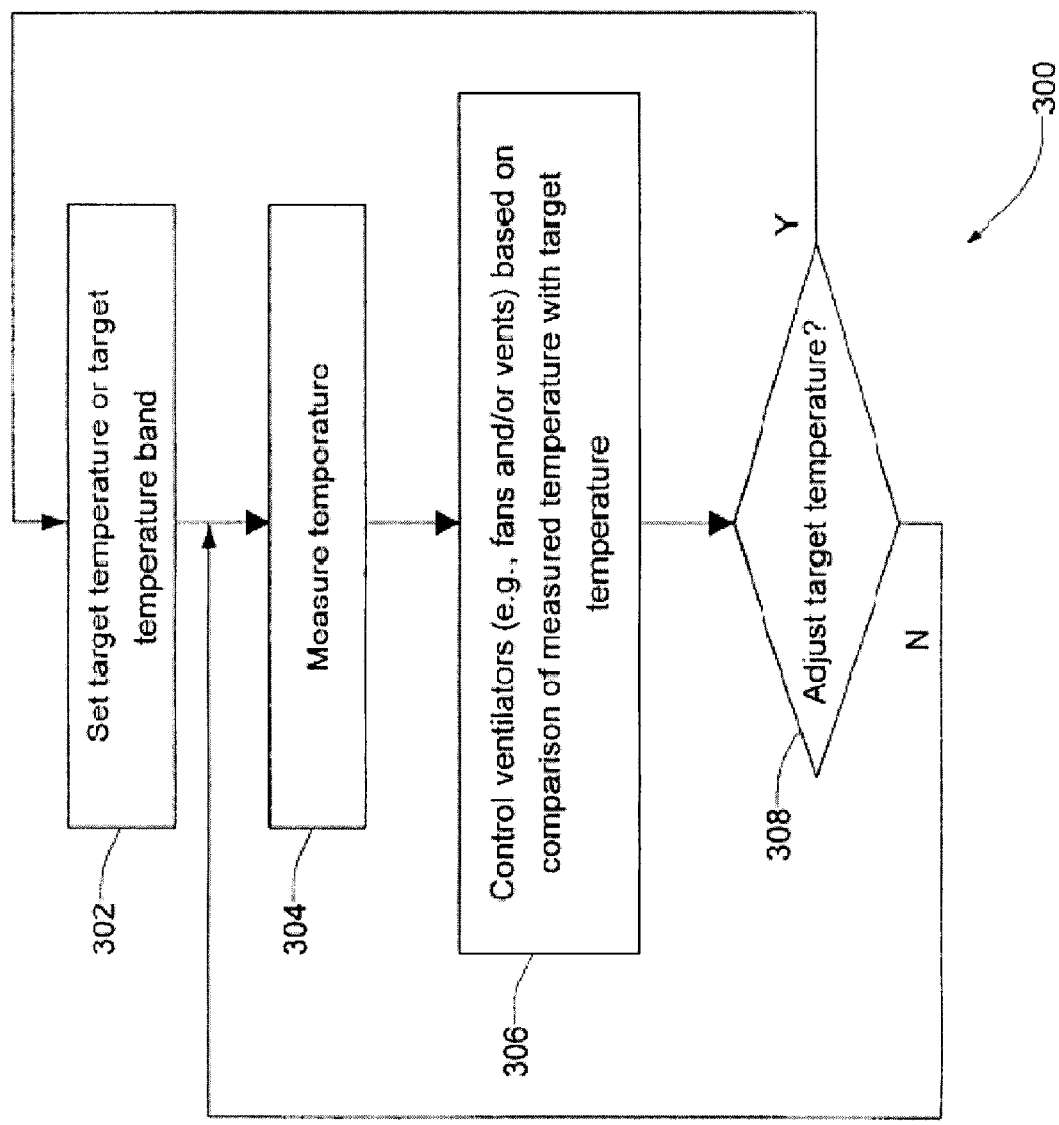
FIG. 4 is a flow chart illustrating an embodiment of a method for controlling the temperature of an IHS rack.

FIG. 4 illustrates a flow chart of an example method 300 for controlling the temperature of a rack, in accordance with the present disclosure. The method may implemented, for example, by systems 100A and/or 100B described above.

At step 302, the system 100 (e.g., system 100A and/or 100B) may initiate control of the temperature in the rack 170. A target temperature or a target temperature band is set, for example as a default value or by a user of the system. The target temperature set may for example be 25 degrees Celsius or any other temperature suitable for assuring proper working of the electronic components in the rack 170. The target temperature band may for example be 24 to 26 degrees Celsius or any other temperature band suitable for assuring proper working of the electronic components in the rack 170. A default value of 25 degrees Celsius may be used.

At step 304, one or more sensors 150, 152, 154, 156 may take one or more temperature measurements and communicate such temperature measurements to controller 200.

At step 306, controller 200 may compare the sensed temperatures from sensors 152 with the target temperature or the target temperature band, and in response, control ventilators 160, 162, 164 accordingly. For example, controller 200 may control ventilators 160, 162, 164 in order to control (a) the amount of cool air delivered to the system 100 and/or (b) the mixture of warmer air (e.g., air flow that has passed through the rack and/or air flow from outside the rack) with cooling air in the connecting plenum 134.

If the temperature sensors 150, 152, 154, 156 register a temperature greater than the target temperature or target temperature band, controller 200 may control ventilators 160, 162, 164 to increase cooling in the rack 170. For example, controller 200 may control one or more ventilators that provide cool air to the system 100 to increase the amount of cool air delivered into the system, e.g., by turning on or speeding up one or more cool air fans (e.g., ventilator 160 shown in FIG. 1). In addition or alternatively, controller 200 may control one or more ventilators 160, 162, 164 in order to decrease or completely shut off the amount of warmer air (e.g., air flow that has passed through the rack and/or air flow from outside the rack) that enters into the connecting plenum 134 to mix with the cooler air. As one example, controller 200 may turn off or reduce the speed of one or more fans that recycle warmer air into the connecting plenum 134 (e.g., ventilator 164 shown in FIG. 1). As another example, controller 200 may fully or partially close one or more actuated vents that allows warmer air (e.g., air flow that has passed through the rack and/or air flow from outside the rack) to mix with the cooling air in connecting plenum 134.

Alternatively, if the temperature sensors 150, 152, 154, 156 register a temperature lower than the target temperature or target temperature band, controller 200 may control ventilators 160, 162, 164 to decrease cooling in the rack 170. For example, controller 200 may control one or more ventilators that provide cool air to the system 100 to decrease the amount of cool air delivered into the system, e.g., by turning off or slowing down one or more cool air fans (e.g., ventilator 160 shown in FIG. 1). In addition or alternatively, controller 200 may control one or more ventilators 160, 162, 164 in order to increase the amount of warmer air (e.g., air flow that has passed through the rack and/or air flow from outside the rack) that enters into the connecting plenum 134 to mix with the cooler air. As one example, controller 200 may turn on or increase the speed of one or more fans that recycle warmer air into the connecting plenum 134 (e.g., ventilator 164 shown in FIG. 1). As another example, controller 200 may fully or partially open one or more actuated vents that allows warmer air (e.g., air flow that has passed through the rack and/or air flow from outside the rack) to mix with the cooling air in connecting plenum 134.

In some embodiments, controller 200 may use an averaged temperature measurement from one or more sensors 150, 152, 154, 156. The sensed temperature used in the method may be an average temperature of several sensors. An average of the temperature may also be established with a plurality of measurements (from one or multiple sensors) averaged over time. The average temperature may be fully or partly derived from sensors 152 of rack units within the rack, or from discrete rack sensors 150, 154, 156, or a combination of both.

At step 308, a new target temperature or target temperature band may or may not be set (e.g., by controller 200 or by a user). The method may then return to step 304.

Controller 200 may continue to analyze the temperature measurements and adjust the ventilators 160, 162, 164 to meet and maintain the prescribed temperature or temperature band. In other words, steps 304-308 may be repeated as long as desired.

The method for controlling the temperature within the rack 170 may be used to estimate flow rates within the system 100. Flow rates may be estimated within the system 100 by assuming that the cooling air flow into the connecting plenum 134 is the same as the air flow leaving the system. Such estimation is further described below.

The method for controlling the temperature within the rack 170 may also be used to estimate savings made by using less cool air than a similar rack without the disclosed system 100 or compared with other systems. Saved cool air consumption may be estimated as the air moved by the at least one ventilator 160, 162, 164. Thus, a value can be established that quantifies one benefit of the disclosed system 100.

Turning to the estimations of air flow that can be made in certain embodiments of the present disclosure, the following further disclosure is made for a better understanding of such estimations. The following variables may be assumed:

Ti=Temperature of air in the front plenum 130;
Tf=Temperature of cool air to the connecting plenum 134;
Tm=Temperature of warm air to the connecting plenum 134 to be mixed with the cooling air;
Fi=Air flow in the front plenum 130;
Fm=Air flow through the at least one ventilator 160, 162, 164;
Fr=Air flow through the rack 170;
A%=percentage of cool air flow to the connecting plenum 134; and
B%=percentage of warm air flow to the connecting plenum 134.

Air flow through one or more fans (e.g., 160, 162, 164) may be derived from tables indicating the air flow (Fm) based on the rotational speed of the fan(s). Assume further that the cooling air flow into the connecting plenum 134 is the same as the air flow leaving the system 100 and that saved air consumption is the same as the air moved by the one or more fans. Further, the following may be assumed for the system 100:

$$Tf^*A\% + Tm^*B\% = Ti$$

$$A\% + B\% = 100\%$$

Fi and Fr may then be calculated:

$$Tf^*(100\% - B\%) + Tm^*B\% = Ti$$

$$B\% = (Ti - Tf)/(Tm - Tf)$$

$$B\% = Fm/Fi$$

$$Fi = Fm(\text{looked up in table})/B\%$$

$$Fr = Fi - Fm$$

With the disclosed systems and methods, Fi and Fr may be calculated or estimated. The amount of air consumption (Fm) saved for the rack using the systems and method disclosed herein can consequently be looked up based on the rotational speed of the fan(s) (rotations per minute, RPM). The amount of air consumed by the rack may be estimated as Fi.

In operation for a specific embodiment, the approximate flow expressed in percent (based on the total flow rate of the rack in the specific embodiment) required to achieve a mixed temperature of 75 Fahrenheit in a rack full of IHSs based on the cooling air temperature (Tf) delivered to the connecting plenum and the temperature rise in the rack (dT), may be illustrated by the following table. Values of dT are listed in bold in the top row, values of Tf are listed in bold in the first column, and values of the percent of cooling air required to achieve a mixed temperature of 75 Fahrenheit in a rack full of IHSs based on the cooling air temperature (Tf) delivered to the connecting plenum and the temperature rise in the rack (dT) are listed in the corresponding boxes.

|       | 20 dT | 25 dT | 30 dT | 35 dT | 40 dT |
|-------|-------|-------|-------|-------|-------|
| 55 Tf | 50%   | 56%   | 60%   | 64%   | 66%   |
| 57 Tf | 53%   | 58%   | 63%   | 66%   | 69%   |
| 59 Tf | 56%   | 61%   | 65%   | 69%   | 71%   |
| 61 Tf | 59%   | 64%   | 68%   | 71%   | 74%   |
| 63 Tf | 63%   | 68%   | 71%   | 74%   | 77%   |
| 65 Tf | 67%   | 71%   | 75%   | 78%   | 80%   |

The table may thus indicate the required flow for maintaining a specific temperature within a rack. For example, when supplying cool air to the connecting plenum at the temperature of 59 F and the rack temperature rise by 25 F, a flow of 61% of the total flow rate of the rack may be necessary to maintain 75 F in the rack.

Figure 5:
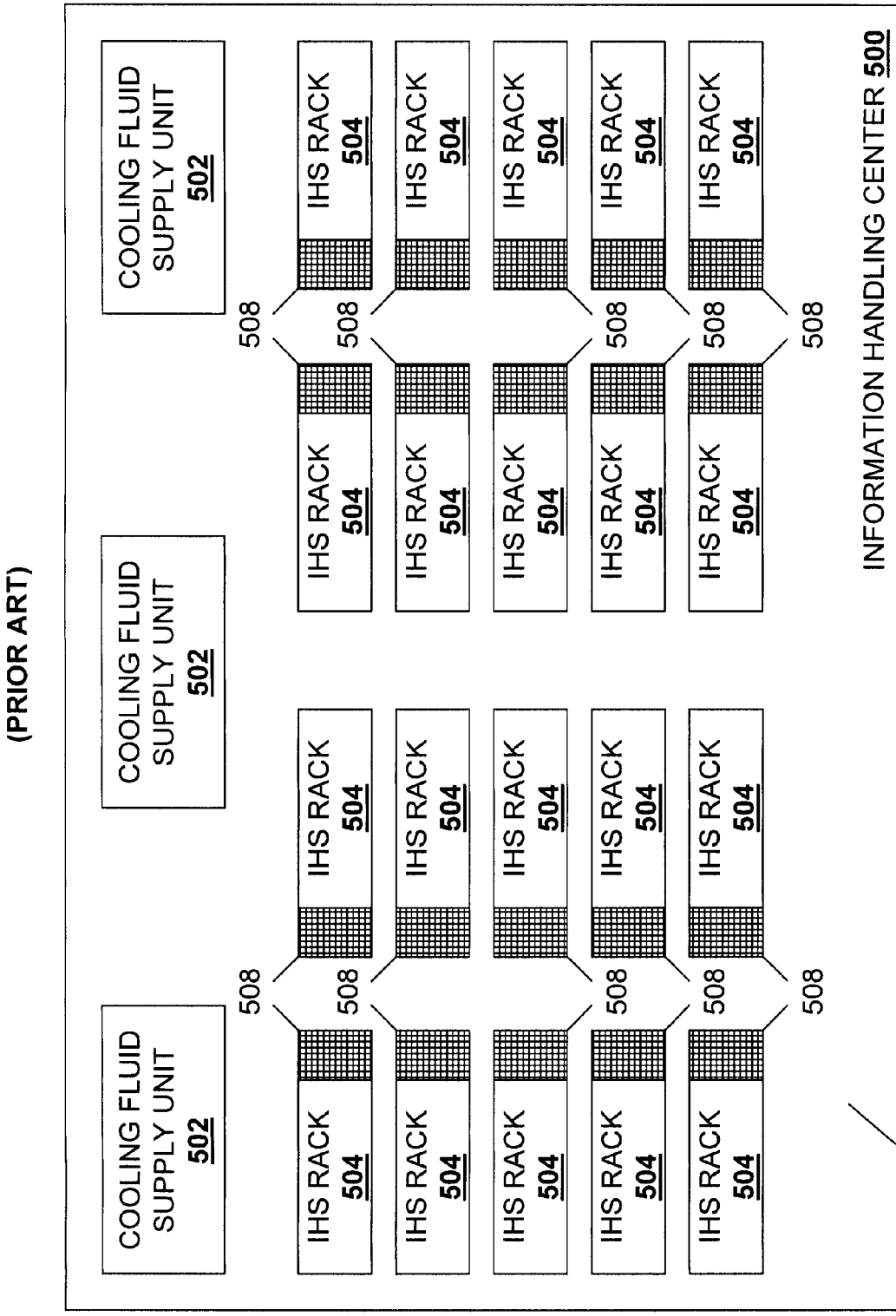
FIG. 5 is a schematic view illustrating an embodiment of an information handling center.

Referring now to FIG. 5, a conventional information handling center 500 is illustrated. The information handling center 500 includes a plurality of cooling fluid supply units 502 and a plurality of IHS racks 504 that are located on a raised floor 506 that defines a pressurized plenum (not illustrated in FIG. 5 but similar to that described above with reference to FIG. 1 and the raised floor 104 that defines the pressurized plenum 138.) A plurality of vents 508 are located adjacent some or all of the IHS racks 504. In an embodiment, the cooling fluid supply units 502 may be Computer Room Air Conditions (CRACs), Computer Room Air Handlers (CRAHs), and/or a variety of other cooling fluid supply units known in the art. In an embodiment, the cooling fluid supply units 502 receive a fluid (e.g., air, however, one of skill in the art will recognize that water and/or a variety of other fluids known in the art may be used in modified systems without departing from the scope of the present disclosure), cool that fluid as it passes through the cooling fluid supply unit 502, and then direct that cooled fluid into the pressurized plenum. In conventional operation, a fluid flow control and a cooling element in the cooling fluid supply unit 502 are both coupled to a temperature sensor that determines the temperature of the fluid supplied to the cooling fluid supply unit 502 before that fluid passes through the cooling fluid supply unit 502 and is cooled. The fluid flow control and cooling element then adjust to cool the fluid and provide that cooled fluid to the pressurized plenum at a desired temperature, and the cooled fluid is then allowed to escape the pressurized plenum from the vents 508. Ventilators/fans in the IHS racks 504 may then draw the cooled fluid into the IHS racks 504 in order to cool heat producing components in the IHS racks. Such conventional information handling centers result in a relatively large waste of energy, as typical information handling centers tend to have particular areas that are hotter than others, and the entire information handling center must be kept cold enough to ensure that the hottest areas are cooled sufficiently. By utilizing systems, described below, that include at least some of the teachings of systems 100A and 100b, described above with reference to FIGS. 1-4, energy savings can be realized, as is discussed in further detail below.

Figure 6A:
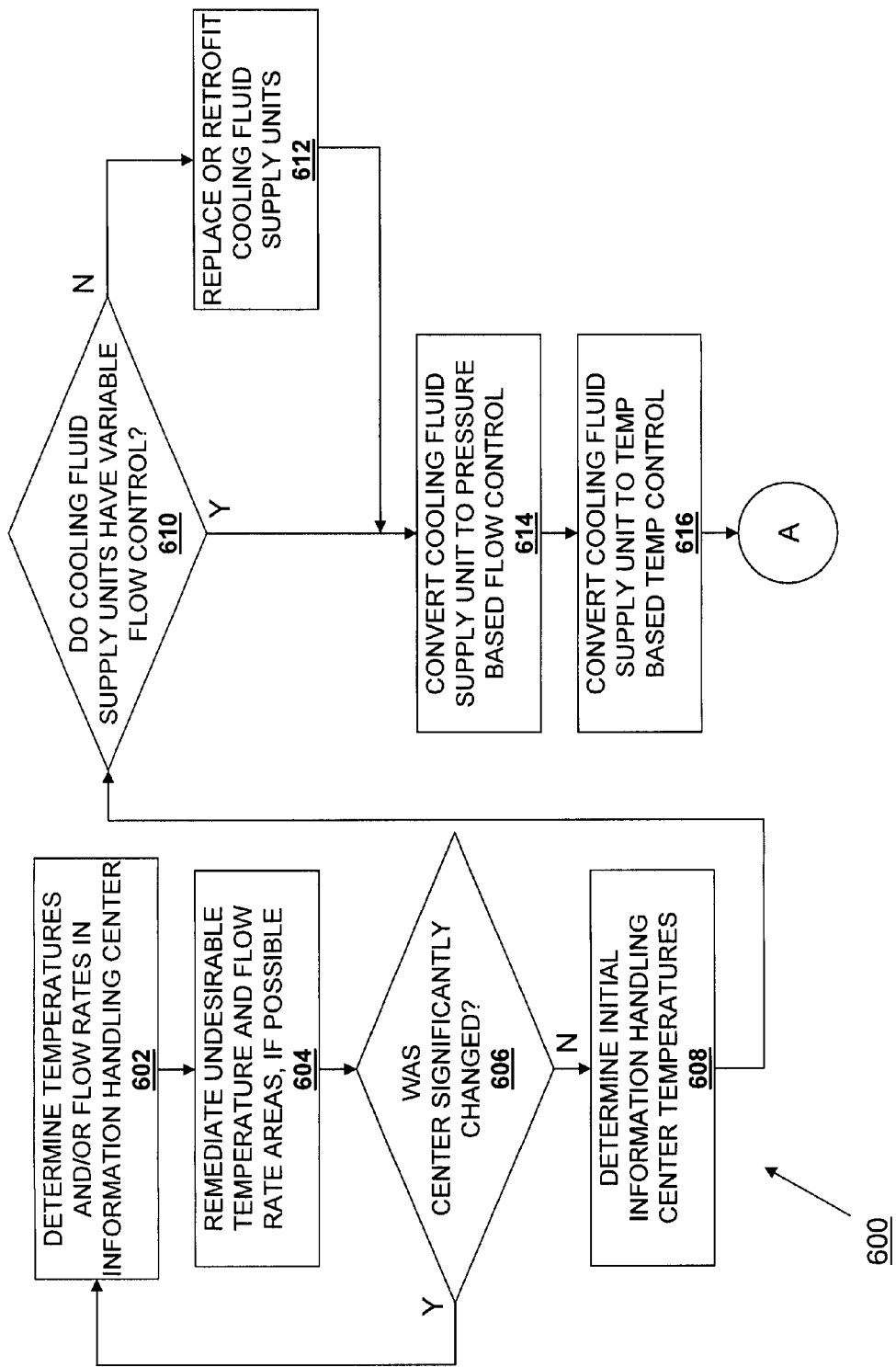
FIG. 6a is a flow chart illustrating an embodiment of a portion of a method for cooling an information handling center.

Referring now to FIGS. 5 and 6a, a method 600 for cooling an information handling center is illustrated. In an embodiment, the method 600 may be used to convert the conventional information handling center 500 to a more energy efficient information handling center. The method 600 begins at block 602 where temperatures and/or flow rates in the conventional information handling center 500 are determined. Temperature measurements may be taken (e.g., at a plurality of different locations in the conventional information handling center 500) and fluid flow rate measurements may be taken (e.g., in the pressurized plenum, at the vents 508, etc.) using methods known in the art. The method 600 then proceeds to block 604 where undesirable temperature and flow rate areas in the information handling center are remediated, if possible. The temperatures and flow rates determined in block 602 of the method 600 may indicate to one of skill in the art that particular areas in the conventional information handling center 500 may be, for example, too high in temperature, too low in flow rate, and/or include a variety of other undesirable information handling center characteristics known in the art. At block 604 of the method 600, it may be possible for one of skill in the art to remediate such undesirable characteristics by, for example, moving, adding, or subtracting cooling fluid supply units 502, moving, adding, or subtracting IHS racks 504, removing obstructions in the pressurized plenum, and/or changing a variety of other factors associated with the information handling center 500.

The method 600 then proceeds to decision block 606 where it is determined whether the information handling center 500 was significantly changed. If the information handling center 500 was significantly changed, the method 600 repeats block 602 to determine temperatures and flow rates in the information handling center 500. Block 604 may be repeated if undesirable temperatures or flow rates persist. If it is determined at block 606 that the information handling center 500 was not significantly changed, the method 600 proceeds to block 608 where a plurality of initial information handling center temperatures at respective locations in the information handling center are determined. In an embodiment, the plurality of initial information handling center temperatures include the average inlet temperatures at the IHS racks 504 and the temperatures at a plurality of temperature check points that may be chosen because they have higher temperatures relative to the rest of the information handling center 500. In an embodiment, blocks 602, 604, and 606 of the method 600 create a situation in the information handling center 500 such that the initial information handling center temperatures determined are temperatures that indicate that the IHS racks 504 are receiving enough cooled fluid to properly cool all of the components located in the IHS racks 504. The method 600 then proceeds to decision block 610 where it is determined whether the cooling fluid supply units 502 have variable flow controls. In an embodiment, variable flow controls allow the fluid flow rate of fluid through the cooling fluid supply units 502 to be varied. If it is determined that the cooling fluid supply unit(s) do not have variable flow control, the method 600 proceeds to block 612 where the cooling fluid supply unit(s) 502 are replaced with cooling fluid supply units with variable flow control, or else the cooling fluid supply unit(s) 502 are retrofitted with variable flow control.

Figure 7:
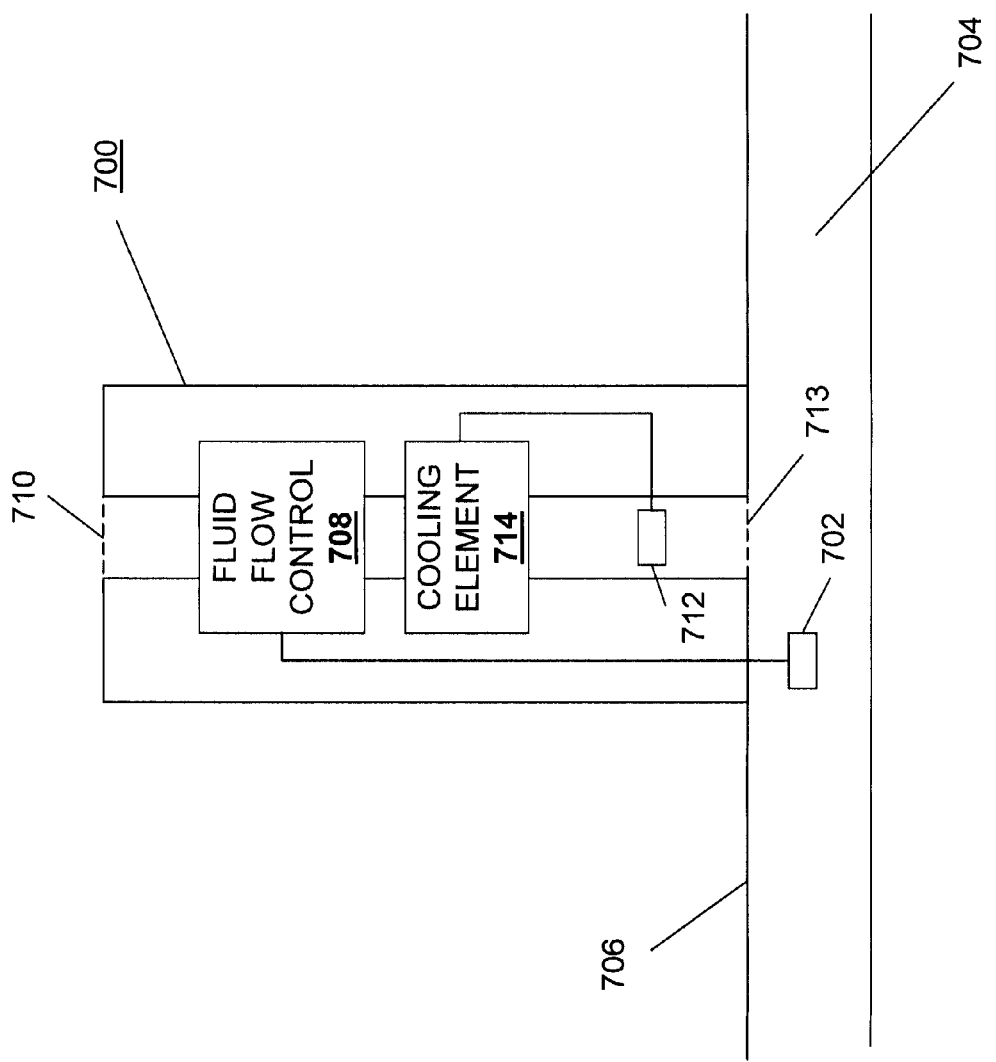
FIG. 7 is a schematic view illustrating an embodiment of a cooling fluid supply unit.

Referring now to FIGS. 6a and 7, if it is determined in block 610 of the method 600 that the cooling fluid supply units have variable fan control, or following block 612 of the method 600, the method 600 proceeds to block 614 where the cooling fluid supply unit(s) are converted to pressure based flow control. In an embodiment illustrated in FIG. 7, a cooling fluid supply unit 700 that has been converted to pressure based flow control is illustrated. The cooling fluid supply unit 700 includes a pressure sensor 702 that is operable to determine the pressure in a pressurized plenum 704 (which may be, for example, the pressurized plenum 138 described above with reference to FIG. 1) defined by a raised floor 706 (which may be, for example, the raised floor 104 described above with reference to FIG. 1). The pressure sensor 702 is coupled to a fluid flow control 708 that is located in the cooling fluid supply unit 700 such that the flow rate of a fluid supplied to the cooling fluid supply unit 700 (e.g., through the inlet 710) and passing through the fluid flow control 708 depends on the pressure in the pressurized plenum 704. The method 600 then proceeds to block 616 where the cooling fluid supply unit(s) are converted to temperature based temperature control. In the embodiment illustrated in FIG. 7, the cooling fluid supply unit 700 has been converted to temperature based temperature control. The cooling fluid supply unit 700 includes a temperature sensor 712 that is operable to determine the temperature of fluid that is being supplied to the pressurized plenum 704 (e.g., through an outlet 713). The temperature sensor 712 is coupled to the cooling element 714 such that the temperature at which the cooling element 714 cools a fluid supplied to the cooling fluid supply unit 700 depends on the temperature of the cooled fluid supplied to the pressurized plenum 704. In another embodiment, the cooling fluid supply unit 700 may include a temperature sensor (similar to temperature sensor 712) that is operable to determine the temperature of fluid that is being supplied to the cooling fluid supply unit 700 (e.g., through the inlet 710). The temperature sensor may be coupled to the cooling element 714 such that the temperature at which the cooling element 714 cools a fluid supplied to the cooling fluid supply unit 700 depends on the temperature of the cooled fluid supplied to the cooling fluid supply unit 700.

Figure 6B:
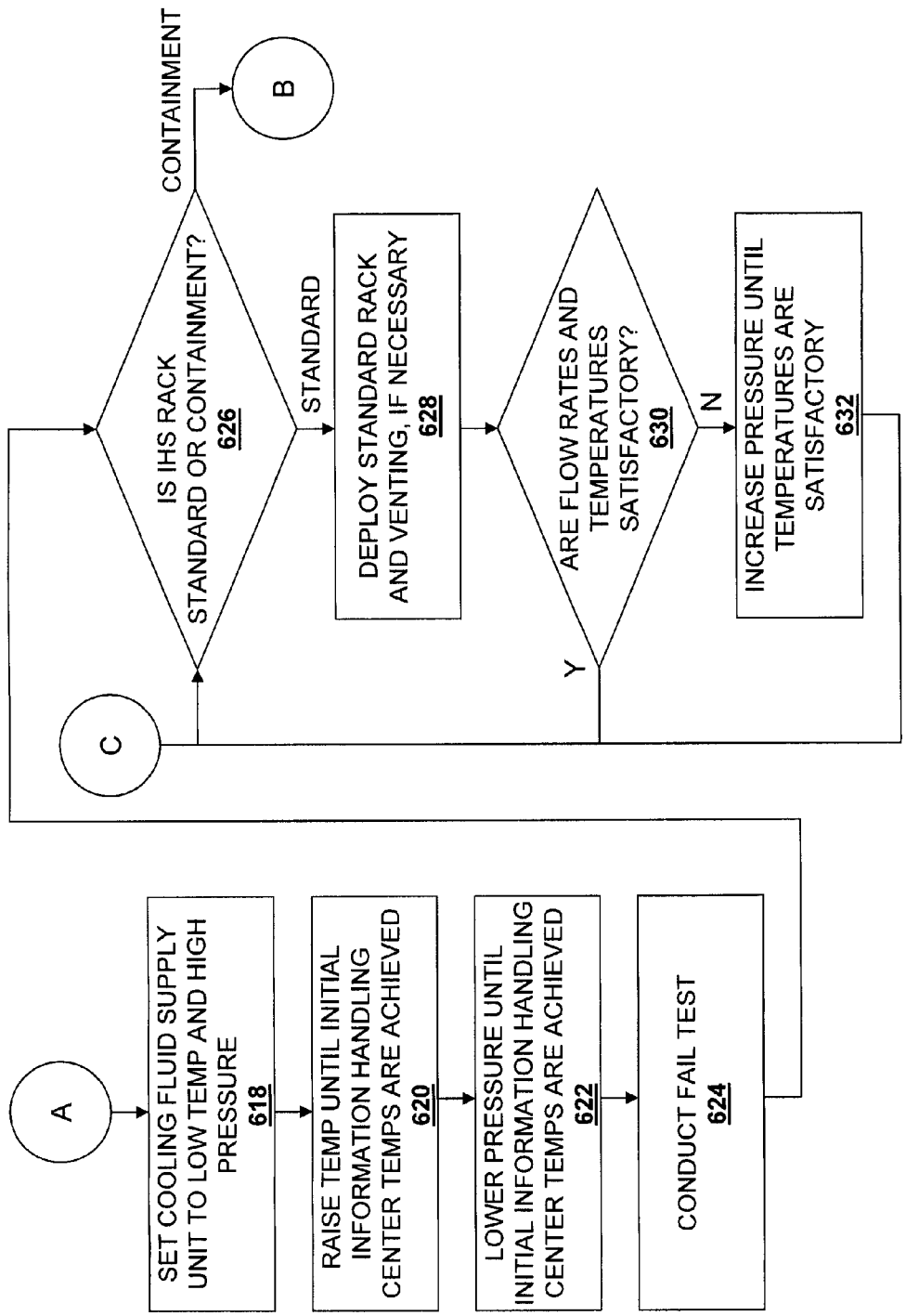
FIG. 6b is a flow chart illustrating an embodiment of a portion of a method for cooling an information handling center.
Figure 6C:
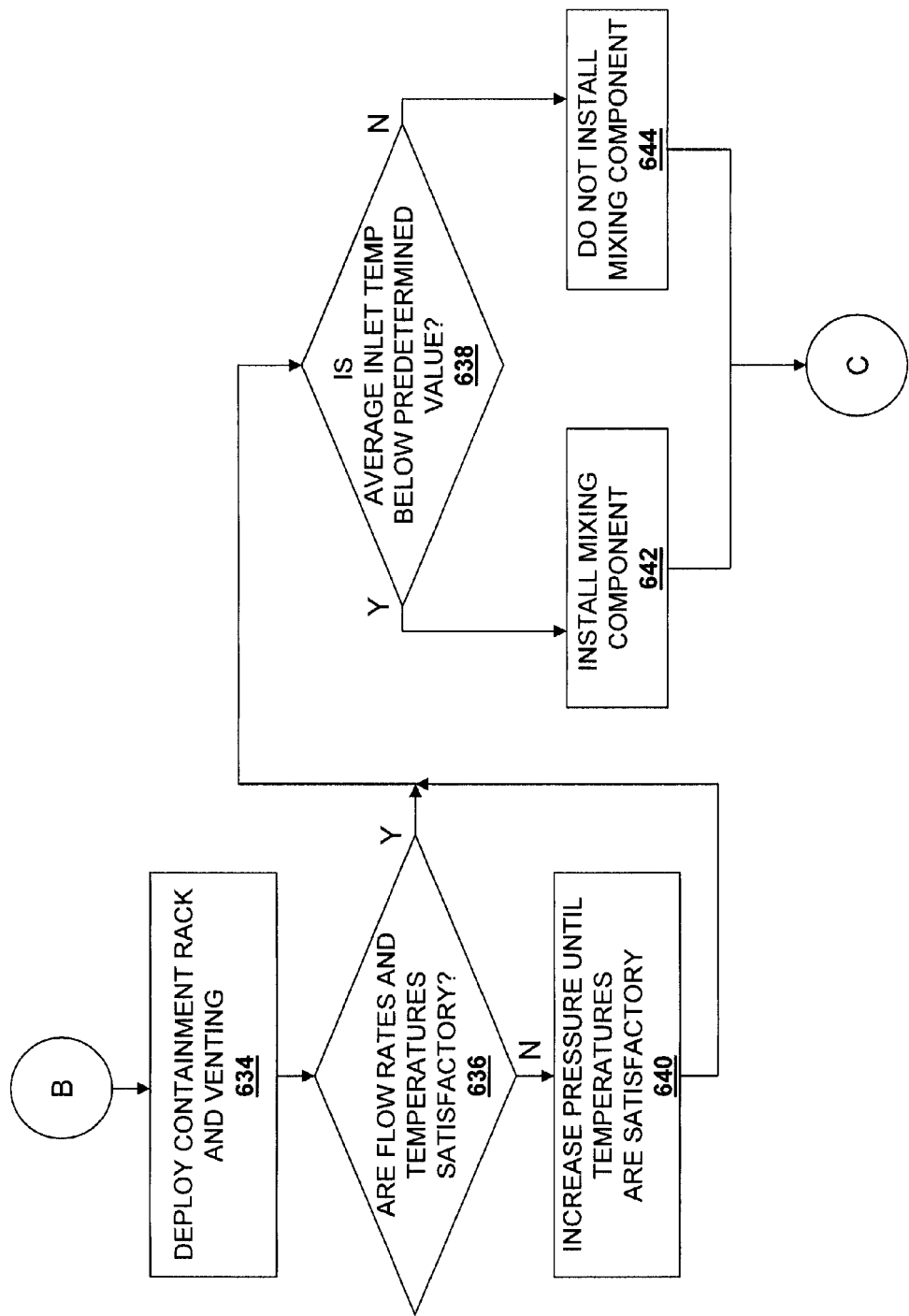
FIG. 6c is a flow chart illustrating an embodiment of a portion of a method for cooling an information handling center.

Referring now to FIGS. 6b and 7, the method 600 proceeds to block 618 where the cooling fluid supply unit(s) are set to low temperature and high pressure. In an embodiment, the cooling element 714 in the cooling fluid supply unit(s) 700 may be set to its lowest temperature setting and the fluid flow control 708 in the cooling supply unit(s) 700 may be set to their highest flow settings to provide the coolest fluid at the highest pressure possible in the pressurized plenum 704. In an embodiment, the cooling supply unit(s) 700 may be set to a low temperature that is not their lowest temperature setting and the fluid flow control 708 in the cooling supply unit(s) 700 may be set to a flow setting that is not their highest flow setting, while still providing the fluid at a sufficient cool temperature and high pressure for the method 600. The method 600 then proceeds to block 620 where the temperature is raised until at least some of the initial information handling center temperatures, determined in block 608 of the method 600, are achieved. In an embodiment, the cooling element 714 in the cooling supply unit(s) is adjusted until a plurality of subsequent information handling center temperatures (e.g., the average inlet temperatures to the IHS racks 504) are achieved, at the respective locations in which the initial information handling center temperatures were taken in block 608, that are within a predetermined temperature range of the initial information handling center temperatures taken in block 608. Thus, the cooling element is adjusted until the temperature of the cooled fluid at the inlet of the IHS racks 504 is close to the temperature determined in block 608. The method 600 then proceeds to block 622 of the method 600 where the pressure is lowered until at least some of the initial information handling center temperatures, determined in block 608 of the method 600, are achieved. In an embodiment, the fluid flow control 708 in the cooling supply unit(s) are used to adjust the pressure in the pressurized plenum until a plurality of subsequent information handling center temperatures (e.g., the temperatures at a plurality of temperature check points that were chosen because they have higher temperatures relative to the rest of the information handling center 500) are achieved, at the respective locations in which the initial information handling center temperatures were taken in block 608, that are within a predetermined temperature range of the initial information handling center temperatures taken in block 608. Thus, the fluid flow control is adjusted until the temperature of the cooled fluid at the temperature check points is close to the temperatures determined in block 608.

Figure 8:
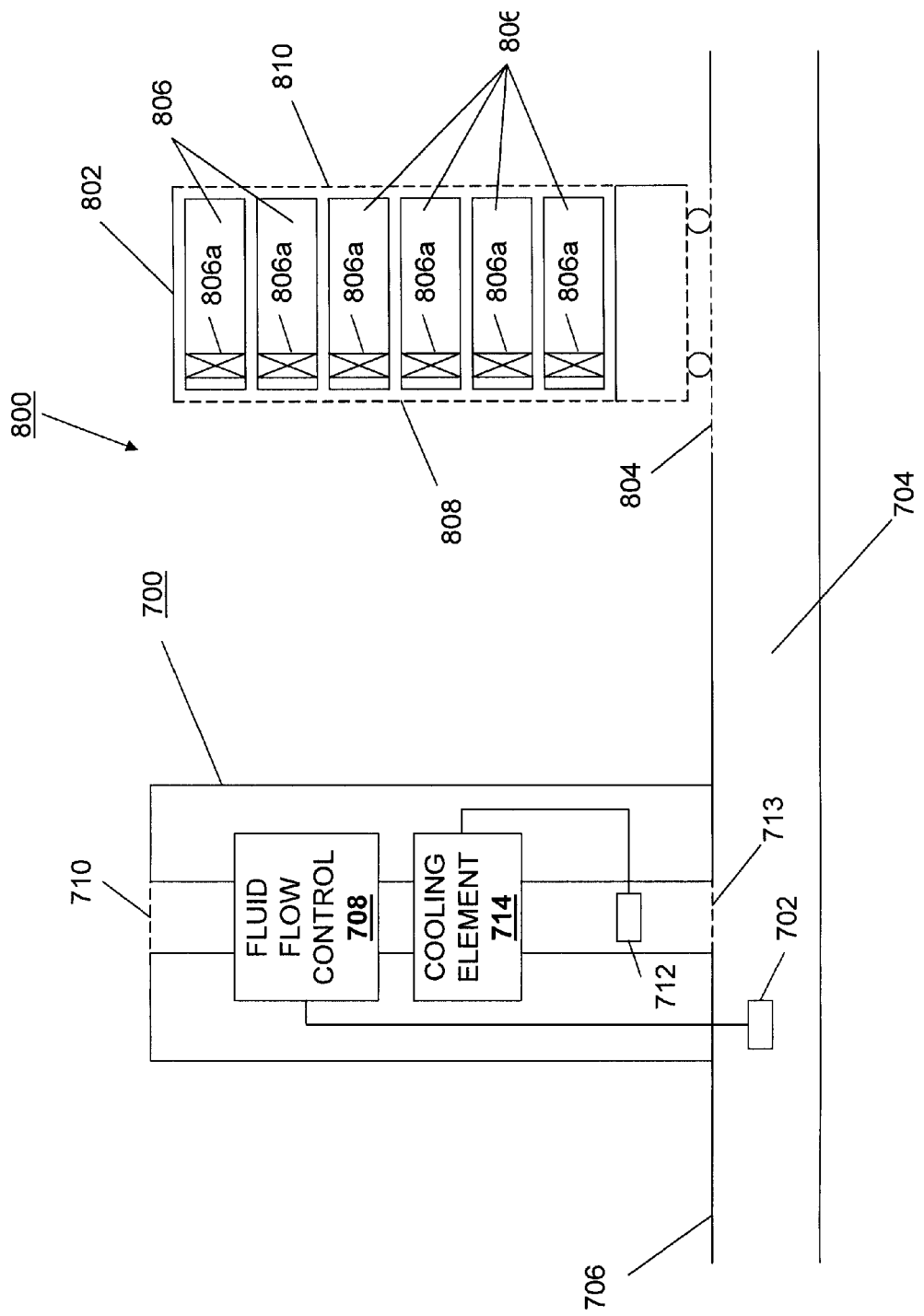
FIG. 8 is a schematic view illustrating an embodiment of the cooling fluid supply unit of FIG. 7 coupled to an IHS rack by a pressurize plenum.
Figure 9:
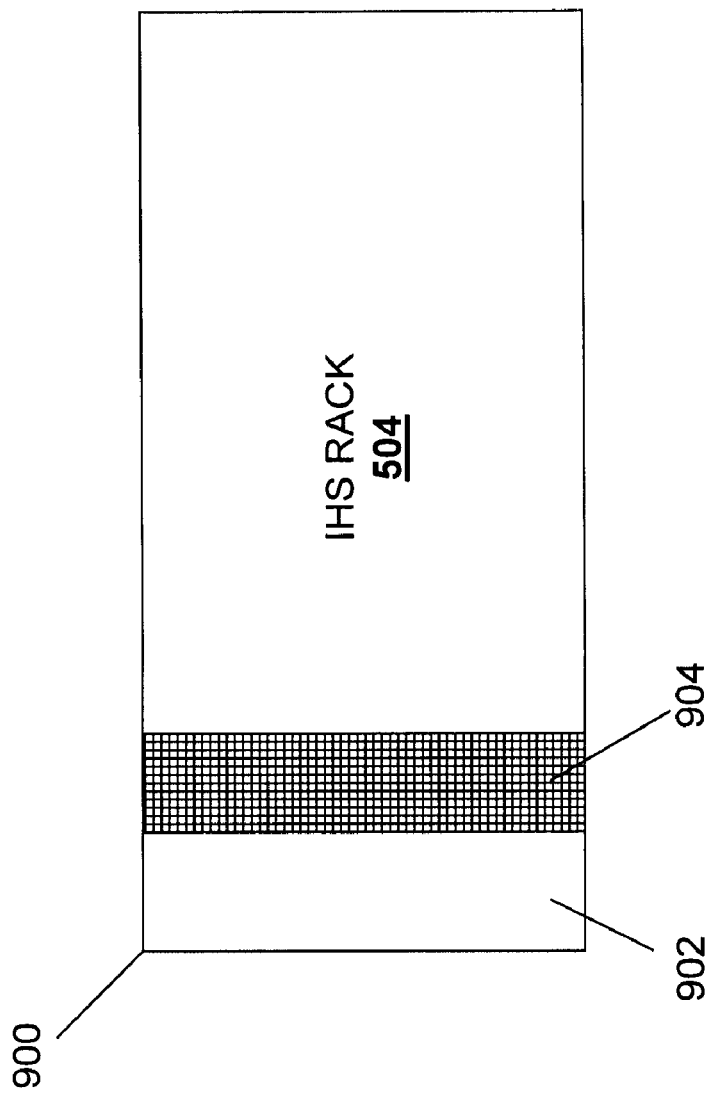
FIG. 9 is a schematic view illustrating an embodiment of a vent.

Referring now to FIG. 8, an information handling center 800 modified by the method 600 through block 622 is illustrated. The information handling center 800 includes at least one cooling fluid supply unit (e.g., the cooling fluid supply unit 700 described above with reference to FIG. 7), along with at least one IHS rack 802 that may be, for example, one of the IHS racks 504 described above with reference to FIG. 5. The IHS rack 802 is located on the raised floor 706 adjacent a vent 804 (which may be one of the vents 508, described above with reference to FIG. 5) and includes a plurality of IHSs 806 positioned in the IHS rack 802 between a front rack inlet 808 and a rear rack outlet 810. Each of the IHSs 806 includes a ventilator 806a (e.g., a fan) that is operable to draw air through the IHS 806. With the cooling fluid supply unit(s) 700 converted to pressure based flow control and temperature based temperature control, the information handling center 800 functions as follows: Following blocks 620 and 622 of the method 600, the cooling element 714 and the fluid flow control 708 in the cooling fluid supply unit(s) 700 are set to provide cooled fluid in the pressurized plenum 704 at a temperature and pressure that is sufficient to properly cool the IHSs 806. As the IHSs 806 heat up, the ventilators 806a are activated using methods known in the art to draw cooled fluid through the IHS rack 802 such that it is passes over the IHSs 806. Drawing cooled fluid through the IHS rack 802 causes cooled air to be drawn out of the pressurized plenum 704 and results in a pressure drop in the pressurized plenum 704. The pressure drop in the pressurized plenum 704 is detected by the pressure sensor 702 and, in response, the fluid flow control 708 increases the flow rate of the fluid passing through the cooling fluid supply unit(s) 700 such that fluid is cooled and directed into the pressurized plenum to increase the pressure in the pressurized plenum 704 and compensate for the pressure loss that occurred due to the IHS rack 802 using cooled air from the pressurized plenum 704 to cool its components.

Thus, the use of cooled air from the pressurized plenum 704 by the IHS rack(s) 802 results in a pressure drop in the pressurized plenum 704 that is recognized and compensated for by the cooling fluid supply unit(s) 700, ensuring proper cooling of the IHSs 806 in the IHS racks 802.

Referring now to FIGS. 6b and 8, the method 600 then proceeds to block 624 where a fail test is conducted. While the fail test is described at block 624 of the method 600, one of skill in the art will recognize that the fail test may be performed at multiple occasions throughout the method 600. In an embodiment, the fail test may be conducted by turning off one or more of the cooling fluid supply units 700 in the information handling center 800 and measuring the increase in fluid flow rates in the fluid flow controls 708 of the cooling fluid supply units 700 that will occur to compensate for the drop in pressure in the pressurized plenum 704 that results from the one or more cooling fluid supply units 700 no longer directing cooling fluid into the pressurized plenum 704. These increases in fluid flow rates in the fluid flow controls 708 may be compared to a maximum desired fluid flow rate value to determine whether, for example, additional cooling fluid supply units 700 need to be added to the information handling center 800 in order to compensate for a possible failure of one or more of the cooling fluid supply units 700.

The method 600 may then proceeds to decision block 626 where an IHS rack is added and it is determined whether the IHS rack is a standard rack or a containment rack. If the IHS rack to be added is a standard rack, the method 600 proceeds to block 628 where a standard rack and/or venting are deployed, if necessary. In an embodiment, deploying a standard IHS rack and/or venting may include, for example, deploying the IHS racks 504 and/or 802, the vents 508 and/or 804, and or a variety of other standard IHS racks and/or venting known in the art. The IHS racks and/or venting may be added to an information handling center with existing IHS racks and/or venting, or may replace the IHS racks and/or venting in an information handling center. The method 600 then proceeds to decision block 630 where it is determined whether flow rates and temperatures in the information handling center are satisfactory. The flow rates, for example, in the pressurized plenum 704 and/or at the vents 804, the inlet temperatures to the IHS racks 802, and temperatures at the respective locations (the respective locations where the initial information handling center temperatures were determined in block 608) in the information handling center are checked and it is determined whether they are within a predetermined amount of the values that will provide proper cooling for the IHSs 806 in the IHS racks 802 (e.g., the values determined in block 608). If the flow rates and temperatures are providing proper cooling for the IHSs 806 in the IHS racks 802, the method 600 returns to decision block 626 to determine what type of IHS rack to add to the information handling center 800 (if there are no more IHS racks to add to the information handling center 800, the method 600 ends). If the flow rates and temperatures are not providing proper cooling for the IHSs 806 in the IHS racks 802, the method 600 proceeds to block 632 where the pressure of the pressurized plenum 704 is increased until the temperatures in the information handling center 800 are satisfactory. The fluid flow controls 708 in the cooling fluid supply units 700 may be adjusted to increase the flow rates of the fluid through the cooling fluid supply units 700 to direct more cooled fluid into the pressurized plenum 704 and increase the pressure in the pressurized plenum 704. The increase of pressure in the pressurized plenum 704 will increase the amount of cooled fluid supplied to the IHS racks 802 and, in turn, lower the temperatures in the IHS racks 802 and other areas of the information handling center 800 until the temperatures in the information handling center 800 are within a predetermined temperature range of the temperatures that provide proper cooling of the IHSs 806 in the IHS rack 802. The method 600 then returns to decision block 626 to determine what type of IHS rack to add to the information handling center 800 (if there are no more IHS racks to add to the information handling center 800, the method 600 ends).

Figure 10:
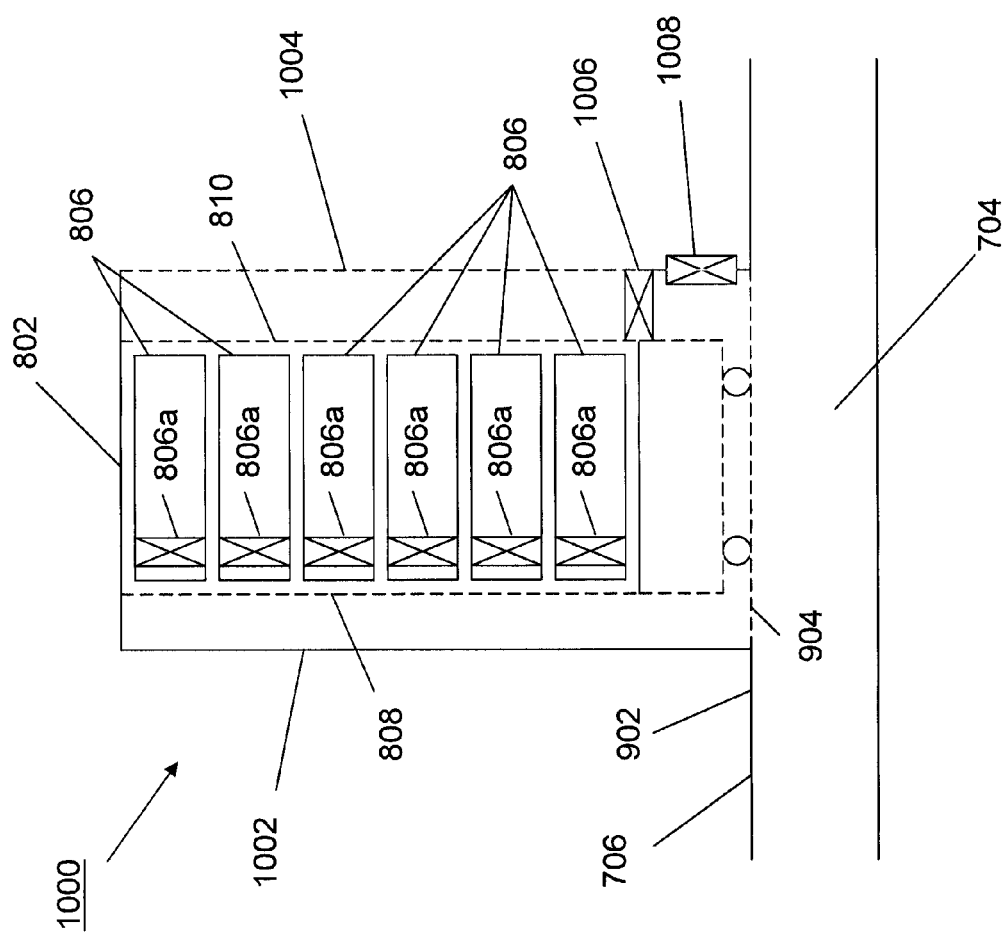
FIG. 10 is a schematic view illustrating an embodiment of containment rack.
Figure 11:
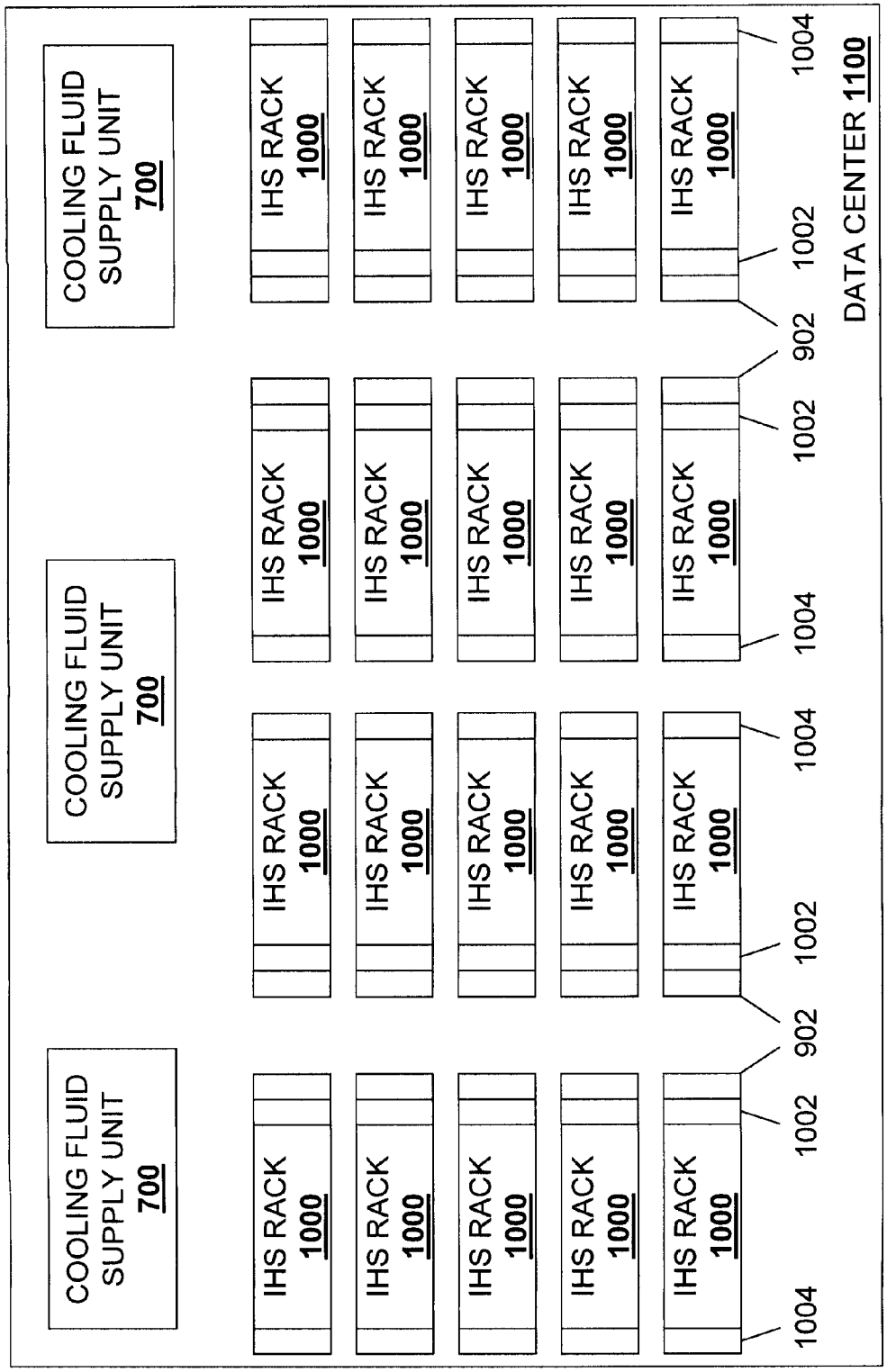
FIG. 11 is a schematic view illustrating an embodiment of an information handling center including the vent of FIG. 9 and the containment rack of FIG. 10.
Figure 12:
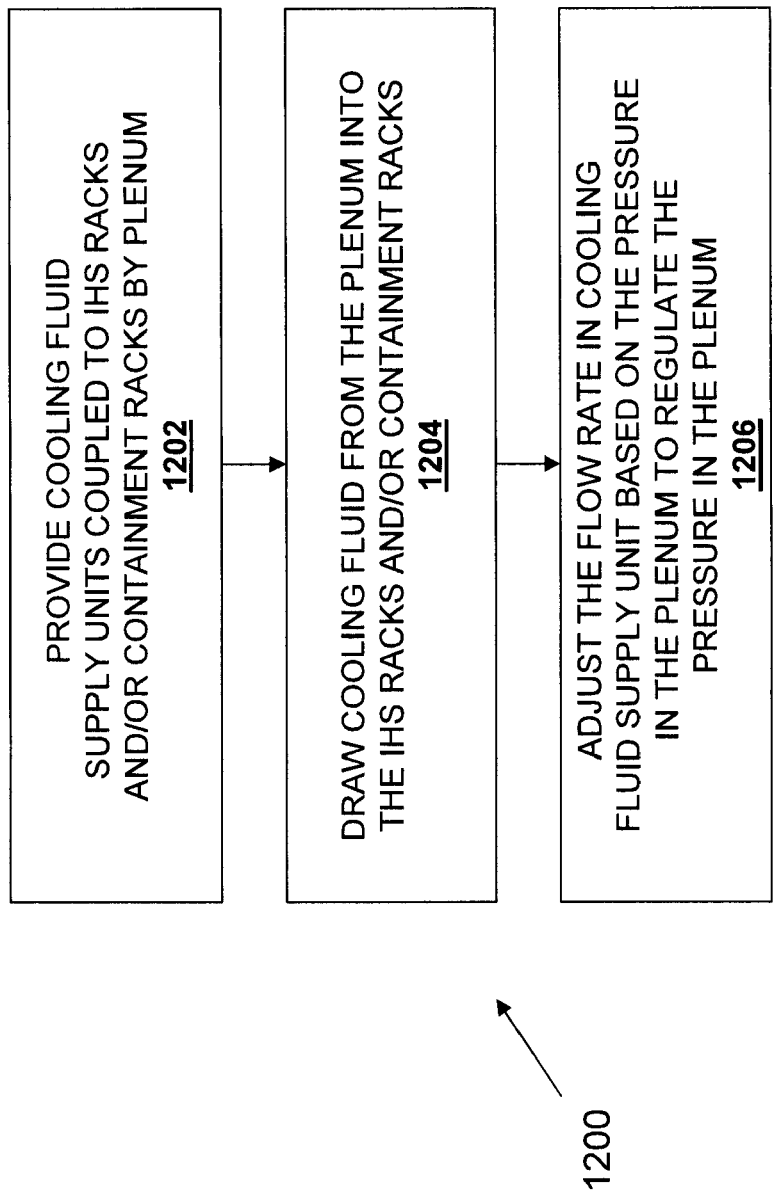
FIG. 12 is a flow chart illustrating an embodiment of a method for cooling an information handling center.

Referring now to FIGS. 5, 6b, 6c, 9, 10 and 11, if at decision block 626 of the method 600, it is determined that the IHS rack to be added to the information handling center is a containment rack, the method 600 proceeds to block 634 where a containment rack and/or venting is deployed. In an embodiment, one or more of the vents 508, illustrated in FIG. 5, may be replaced and/or modified with a vent 900 that includes a fluid impeding portion 902 and a fluid passageway portion 904, illustrated in FIG. 9. The IHS rack 504 and/or 800 may then be modified to provide a containment rack 1000 by coupling a front containment member 1002 to the IHS rack 800 adjacent the front rack inlet 808 that engages the vent 900 such that the fluid impeding portion 902 is located on a first side of the front containment member 1002 and the fluid passageway portion 904 is located on a second side of the front containment member 1002, as illustrated in FIG. 10. A rear containment member 1004 may be coupled to the IHS rack 800 adjacent the rear rack outlet 810. The illustrated embodiment shows the rear containment member 1004 including a plurality of ventilators 1006 and 1008, the function of which will be described in further detail below. However, the rear containment member 1004 may only include features that ensure that substantially all of the cooled fluid drawn from the pressurized plenum 704 through the fluid passageway portion 904 of the vent 900 is directed to a location adjacent the front rack inlet 808 on the containment rack 1000. In an embodiment, the front containment member 1004 and rear containment member 1006 may be coupled to the raised floor using seals to ensure that substantially all of the cooled fluid that exits the pressurized plenum 704 through the fluid passageway portion 904 is directed to a location adjacent the front rack inlet 808 on the containment rack 1000. In an embodiment, the containment rack 1000 includes some or all of the components and functionality of the systems 100A and 100B, described above with reference to FIGS. 1-4. FIG. 11 illustrates an information handling center 1100 that have been converted (e.g., from the conventional information handling center 500, described above with reference to FIG. 5) such that all of the IHS racks are containment racks 1000. However, the disclosure is not so limited, and one of skill in the art will recognize that the information handling center 1100 may include a combination of IHS racks such as, for example, the IHS racks 504 and 802, and containment racks 1000. While the containment rack 1000 has been described as being provided by modifying the IHS rack 802, the containment rack 1000 may be provided as an entirely new rack that includes the features described above for the containment rack 1000 and/or the systems 100A and 100B.

The method 600 then proceeds to decision block 636 where it is determined whether flow rates and temperatures in the information handling center are satisfactory. The flow rates, for example, in the pressurized plenum 704 and/or at the vents 804, the inlet temperatures to the IHS racks 802 and/or containment racks 1000, and temperatures at the respective locations (the respective locations where the initial information handling center temperatures were determined in block 608) in the information handling center are checked and it is determined whether they are within a predetermined amount of the values that will provide proper cooling for the IHSs 806 in the IHS racks 802 and the containment racks 1000. If the flow rates and temperatures are providing proper cooling for the IHSs 806 in the IHS racks 802 and/or the containment racks 1000, the method 600 then proceeds to decision block 638. If the flow rates and temperatures are not providing proper cooling for the IHSs 806 in the IHS racks 802 and/or the containment racks 1000, the method 600 proceeds to block 640 where the pressure of the pressurized plenum 704 is increased or decreased until the temperatures in the information handling center are satisfactory. The fluid flow controls 708 in the cooling fluid supply units 700 may be adjusted to increase or decrease the flow rates of the fluid through the cooling fluid supply units 700 to direct more or less cooled fluid into the pressurized plenum 704 and increase or decrease the pressure in the pressurized plenum 704. The increase of pressure in the pressurized plenum 704 will increase the amount of cooled fluid supplied to the IHS racks 802 and/or the containment racks 1000 and, in turn, lower the temperatures in the IHS racks 802 and/or the containment racks 1000 and other areas of the information handling center 800 until the temperatures in the information handling center 800 are within a predetermined temperature range of the temperatures that provide proper cooling of the IHSs 806 in the IHS racks 802 and/or the containment racks 1000. The decrease of pressure in the pressurized plenum 704 will decrease the amount of cooled fluid supplied to the IHS racks 802 and/or the containment racks 1000 and, in turn, raise the temperatures in the IHS racks 802 and/or the containment racks 1000 and other areas of the information handling center 800 until the temperatures in the information handling center 800 are within a predetermined temperature range of the temperatures that provide proper cooling of the IHSs 806 in the IHS racks 802 and/or the containment racks 1000. As is implied above, the containment racks 1000 may focus the cooled fluid in the information handling center 800 in such as way that their addition may allow the pressure in the pressurized plenum 704 to be decreased and still provide proper cooling to the IHSs 806. The method 600 then proceeds to decision block 638.

At decision block 638, it is determined whether the average inlet temperature to the containment racks 1000 is below a predetermined value. In an embodiment, the predetermined value is 72 degrees Fahrenheit. However, the present disclosure is not so limited and one of skill in the art will recognize that a variety of temperatures may be used for the predetermined value. If the average inlet temperature to the containment racks 1000 is below the predetermined value, the method 600 proceeds to block 642 where a mixing component is installed in the containment racks 100. In an embodiment, the mixing component includes the ventilator 1006 and/or the ventilator 1008, illustrated in FIGS. 10 and 13. When the average inlet temperature to the containment racks 1000 is below the predetermined value, the cooled fluid in the pressurized plenum 704 may be lower than is needed to cool the IHSs 806 in the containment rack 1000. The ventilator 1006 may then be used to mix heated fluid that has passed through the containment rack 1000 with the cooled fluid that is being drawn from the pressurized plenum 704 into the containment rack 1000, and the ventilator 1008 may then be used to mix ambient fluid from outside of the containment rack 1000 and the pressurized plenum 704 with the cooled fluid that is being drawn from the pressurized plenum 704 into the containment rack 1000. The mixing of heated or ambient fluid with the cooled fluid being drawn from the pressurized plenum 704 into the containment rack 1000 may be calibrated to provide cooling fluid to the IHSs 806 at a temperature that is proper to sufficiently cool the IHSs 806, thereby reducing the amount of cooled fluid drawn from the pressurized plenum 704 and, in turn, saving energy. The method 600 then returns to decision block 626 to determine what type of IHS rack to add to the information handling center 800 (if there are no more IHS racks to add to the information handling center 800, the method 600 ends). If at decision block 638, it is determined that the average inlet temperature to the containment racks 1000 is not below the predetermined value, the method 600 proceeds to block 644 where no mixing component is installed in the containment racks 100. Ideally, the cooled fluid from the pressurized plenum 704 is delivered to the containment racks 1000 already at the proper temperature to sufficiently cool the IHSs 806, and the ventilators 1006 are not needed. However, one of skill in the art will recognize situations where it may be desirable to keep the cooled fluid in the pressurized plenum 704 at a temperature that is lower than necessary, thus allowing the ventilator 1006 to be used to optimized the use of the cooled fluid from the pressurized plenum 704. The method 600 then returns to decision block 626 to determine what type of IHS rack to add to the information handling center 800 (if there are no more IHS racks to add to the information handling center 800, the method 600 ends).

Figure 13:
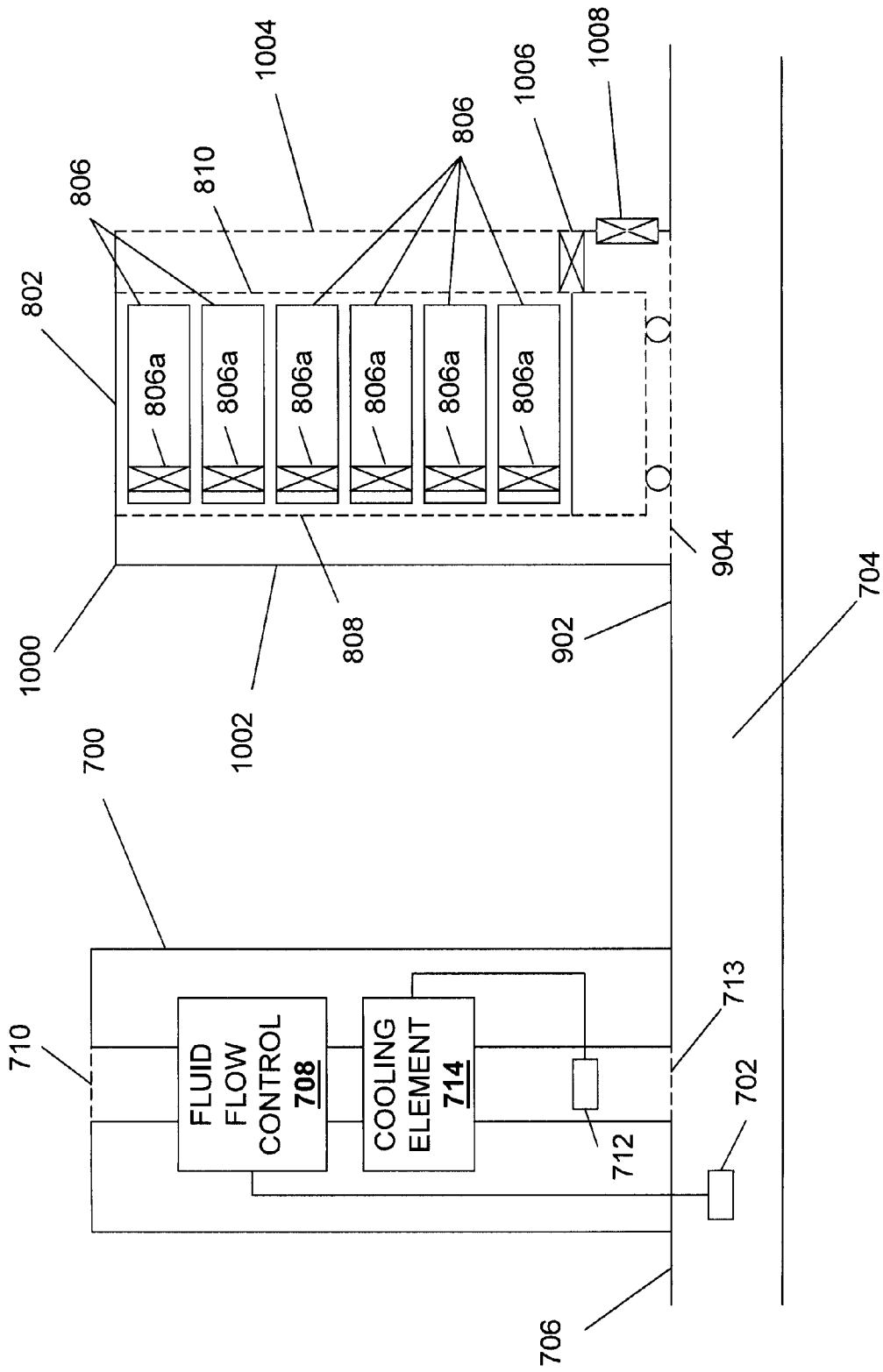
FIG. 13 is a schematic view illustrating an embodiment of the cooling fluid supply unit of FIG. 7 coupled to the containment rack of FIG. 10 by a pressurized plenum.

Referring now to FIGS. 8, 11, 12 and 13, a method 1200 for cooling an information handling center is illustrated. The method 1200 begins at block 1202 where a plurality of cooling fluid supply units coupled to a plurality of IHS racks by a plenum is provided. Any combination of the cooling fluid supply units 700, IHS racks 802, and containment racks 1000 may be provided in an information handling center. The method 1200 then proceeds to block 1204 where cooling fluid is drawn from the pressurized plenum into the IHS racks 802 and/or the containment racks 1000. The following example will describe the method 1200 as it applies to the containment rack 1000. However, one of skill in the art will recognize that the method 1200 may apply to an information handling center that also utilizes IHS racks similar to the IHS racks 802, discussed above. Referring now to FIG. 13, as the IHSs 806 in the containment racks 1000 heat up, the ventilators 806 are activated to draw cooled fluid into the containment racks 1000 through the fluid passageway portion 904 of the vents 900. Due to the front containment member 1002 and the rear containment member 1004, substantially all of the cooled fluid drawn from the pressurized plenum 704 is directed to a location adjacent the front rack inlet 808 and enters the front rack inlet 808 to pass over the IHSs 806 and cool them. That fluid is heated by the IHSs 806 and exits through the rear rack outlet 810 as heated fluid. That heated fluid may also exit the containment rack 1000 through passageways in the rear containment member 1004. However, if the average inlet temperature of the cooled fluid drawn from the pressurized plenum 704 is cooler than the predetermined value, discussed above, the ventilator 1006 may be activated to mix some or all of that heated fluid with the cooled fluid drawn from the pressurized plenum 704 in order to heat up the fluid that is being directed to the location adjacent the front rack inlet 806. Furthermore, if the average inlet temperature of the cooled fluid drawn from the pressurized plenum 704 is cooler than the predetermined value, discussed above, the ventilator 1008 may be activated to mix ambient fluid from outside of the containment rack 1000 and the pressurized plenum 704 with the cooled fluid drawn from the pressurized plenum 704 in order to heat up the fluid that is being directed to the location adjacent the front rack inlet 806.

The method 1200 then proceeds to block 1206 where the flow rate in the cooling fluid supply units is adjusted based on the pressure in the pressurized plenum in order to regulate the pressure in the pressurized plenum. Drawing cooled fluid into the containment rack 802 causes cooled fluid to be drawn out of the pressurized plenum 704 and results in a pressure drop in the pressurized plenum 704. The pressure drop in the pressurized plenum 704 is detected by the pressure sensor 702 and, in response, the fluid flow control 708 increases the flow rate of the fluid passing through the cooling fluid supply unit(s) 700 such that fluid is cooled and directed into the pressurized plenum to increase the pressure in the pressurized plenum 704 and compensate for the pressure loss that occurred due to the containment rack 802 using cooled air from the pressurized plenum 704 to cool the IHSs 806. Thus, the use of cooled air from the pressurized plenum 704 by the containment racks 802 results in a pressure drop in the pressurized plenum 704 that is recognized and compensated for by the cooling fluid supply unit(s) 700, ensuring proper cooling of the IHSs 806 in the containment racks 802. Furthermore, by using the ventilators 1006 and 1008 to mix heated or ambient fluid with the cooled fluid that is drawn from the pressurized plenum, the fluid that actually passes through the containment racks 1000 and over the IHSs 806 may be heated to a proper temperature for cooling. Such mixing causes less cooling fluid to be drawn from the pressurized plenum 704 and may result in a pressure increase in the pressurized plenum 704. That pressure increase may be detected by the pressure sensor 704 and, in response, the fluid flow control 708 will decrease the flow rate of the fluid passing through the cooling fluid supply unit(s) 700 such that the pressure in the pressurized plenum 704 is decreased to compensate for the pressure rise that occurred due to the containment rack 802 using less cooled air from the pressurized plenum 704 to cool the IHSs 806.

While the rack systems (e.g., the IHS rack 802 and containment rack 1000) described above have been illustrated as exhausting fluid that is heated as it passes through the racks into the information handling center 800, one of skill in the art will recognize that the heated fluid that leaves the racks may be captured and directed to a location outside of the information handling center 800.

Figure 14A:
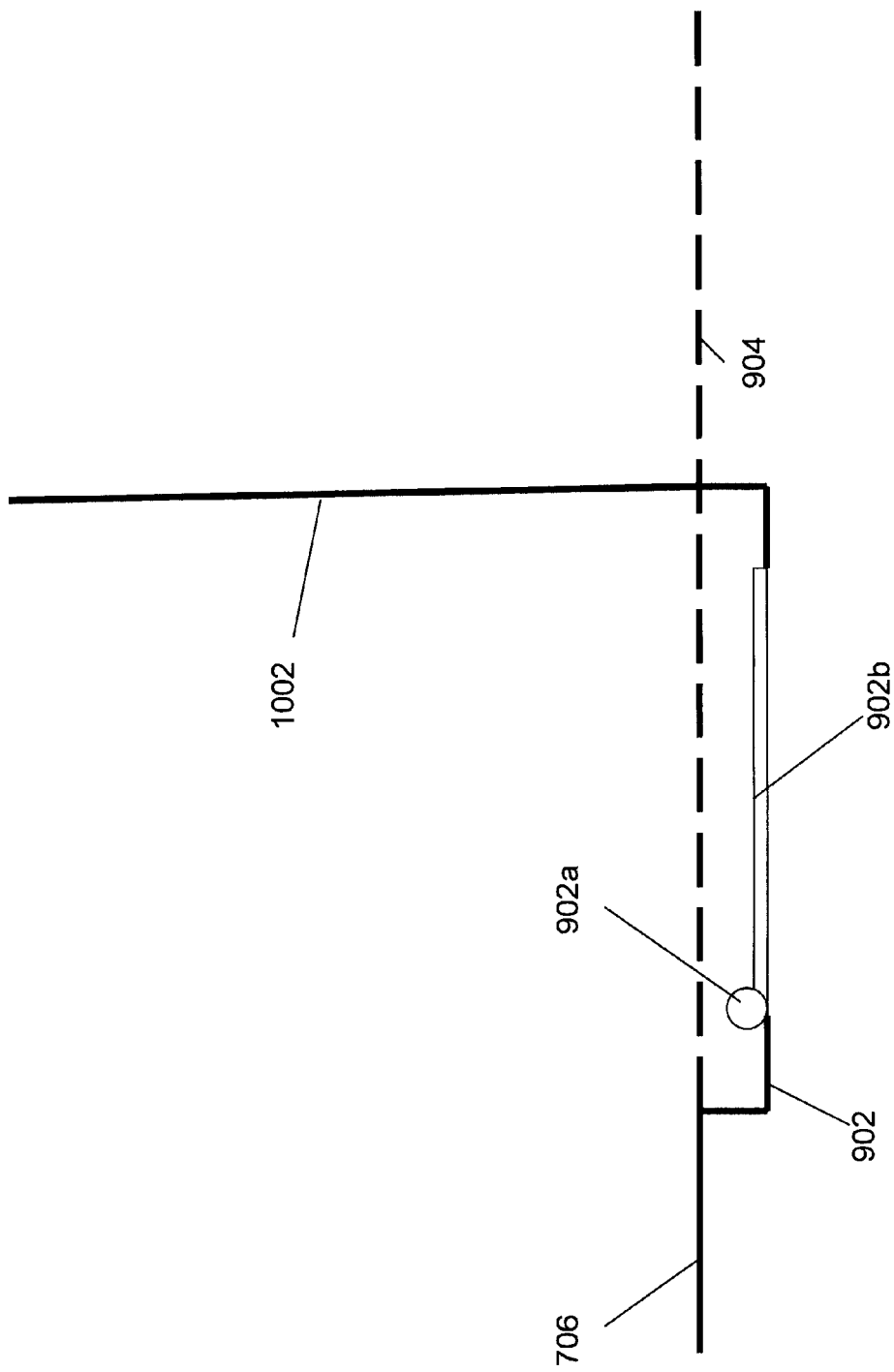
FIG. 14a is a schematic view illustrating an embodiment of a vent including a door in a closed position.
Figure 14B:
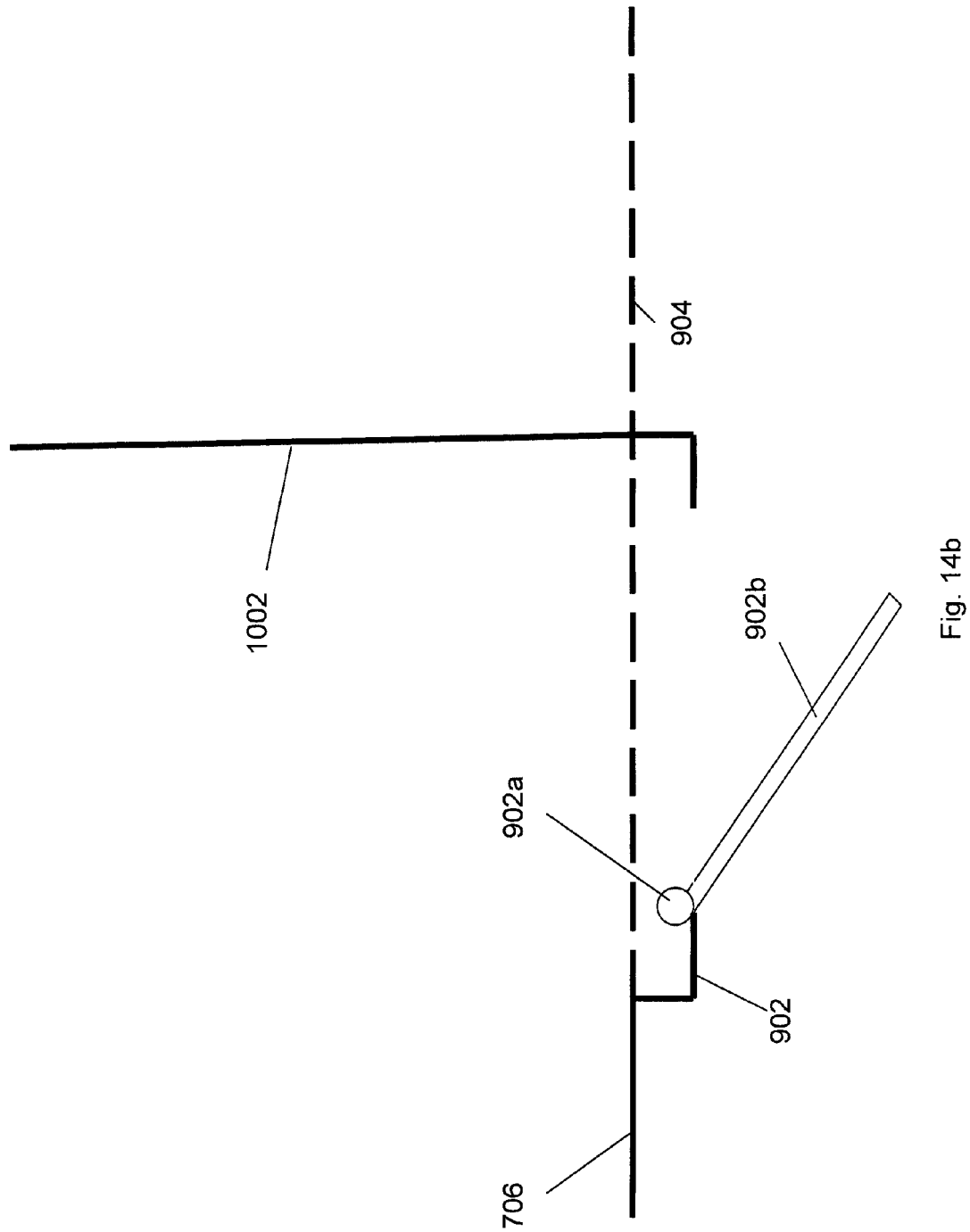
FIG. 14b is a schematic view illustrating an embodiment of the vent of FIG. 14a including the door in an opened position.

Referring now to FIGS. 14*a* and 14*b*, an embodiment of the vent 900 is illustrated. FIGS. 14*a* and 14*b* illustrate the fluid impeding portion 902 of the vent 900 including a hinge 902*a* connected to a door 902*b*. In the event one, multiple, or all of the cooling supply units 700 fail and stop providing cooled fluid to the pressurized plenum 704, the containment racks 1000 may continue to attempt to draw cooled fluid from the pressurized plenum 704 in order to cool the IHSs 806. However, if the cooling fluid supply units 700 are not providing cooled fluid to the pressurized plenum 704, the only fluid available to the containment racks 1000 is the fluid outside the containment racks 1000, the cooling fluid supply units 700, and the pressurized plenum 704. Because of their components, drawing fluid through the cooling fluid supply units 700 may be more than the ventilators 806*a* in the containment racks 1000 are capable of. In such an event, the ventilators 806*a* in the containment racks 1000 may reduce the pressure in the pressurized plenum 704 enough to cause the door 902*b* to open, as illustrated in FIG. 14*b*, such that fluid from outside of the pressurized plenum 704 is drawn into the pressurized plenum 704 and into the containment rack 1000 so that it may be used to cool the IHSs 806 in the containment rack 1000. Furthermore, when the cooling supply units 700 are operating properly, the hinge 902*a* and the pressure of the cooled fluid in the pressurized plenum 704 are sufficient to close the door 902*b* such that the cooled fluid in the pressurized plenum 704 cannot escape through the fluid impeding portion 902 of the vent 900. While the door 902*b* has been illustrated and described as being located adjacent the containment rack 1000, the present disclosure is not so limited, and the door 902b may be located at various locations throughout the information handling center.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An information handling center, comprising:
    an information handling system (IHS) rack configured to receive a cooled fluid from a pressurized plenum, wherein the IHS rack includes at least one ventilator that is operable to cause the cooled fluid to be drawn from the pressurized plenum into the IHS rack, and wherein the IHS rack includes at least one ventilator that is operable to direct a heated fluid that has been heated through the IHS rack such that the heated fluid is combined with the cooled fluid into a mixed fluid and the mixed fluid is directed into at least one rack unit housed in the IHS rack;
    a cooling fluid supply unit coupled to the pressurized plenum and operable to cool a fluid passing through the cooling fluid supply unit and direct the cooled fluid into the pressurized plenum;
    a fluid flow control located in the cooling fluid supply unit and coupled to a pressure sensor that is operable to determine a pressure in the pressurized plenum, wherein the fluid flow control is operable to adjust the flow rate of the fluid passing through the cooling fluid supply unit based on the pressure determined by the pressure sensor; and
    wherein in response to the at least one ventilator directing the heated fluid such that the heated fluid combines with the cooled fluid into the mixed fluid, the pressure sensor detects a pressure increase in the pressurized plenum and the fluid flow control adjusts the flow rate of the fluid passing through the cooling fluid supply unit to reduce the pressure in the pressurized plenum.

2. The information handling center of claim 1, further comprising:
    a cooling element located in the cooling fluid supply unit and coupled to a temperature sensor that is operable to determine a temperature of the cooling fluid supplied to the pressurized plenum, wherein the cooling element is operable to adjust the temperature of the fluid passing through the cooling fluid supply unit based on the temperature determined by the temperature sensor.

3. The system of claim 2, further comprising:
    a cooling element located in the cooling fluid supply unit and coupled to a temperature sensor that is operable to determine a temperature of the cooling fluid supplied to the cooling fluid supply unit, wherein the cooling element is operable to adjust the temperature of the fluid passing through the cooling fluid supply unit based on the temperature determined by the temperature sensor.

4. The system of claim 1, wherein the at least one ventilator is operable to direct the heated fluid into a connecting plenum defined by the IHS rack in order to mix the heated fluid with the cooled fluid, and wherein the mixing of the heated fluid and the cooled fluid reduces the amount of cooled fluid drawn from the pressurized plenum.

5. The system of claim 1, wherein the IHS rack comprises at least one ventilator that is operable to direct an ambient fluid located outside of the IHS rack and the pressurized plenum into a connecting plenum defined by the IHS rack in order to mix the ambient fluid with the cooled fluid drawn from the pressurized plenum, and wherein the mixing of the ambient fluid and the cooled fluid reduces the amount of cooled fluid drawn from the pressurized plenum.

6. The system of claim 1, wherein the IHS rack defines a connecting plenum and a front plenum that are in fluid communication with the pressurized plenum such that cooled fluid drawn from the pressurized plenum travels through the connecting plenum and the front plenum to at least one IHS located in the IHS rack.

7. The system of claim 1, further comprising:
    an additional cooling fluid supply unit coupled to the pressurized plenum and operable to cool a fluid passing through the additional cooling fluid supply unit and direct the cooled fluid into the pressurized plenum;
    a fluid flow control located in the additional cooling fluid supply unit and coupled to a pressure sensor that is operable to determine a pressure in the pressurized plenum, wherein the fluid flow control is operable to adjust the flow rate of the fluid passing through the additional cooling fluid supply unit based on the pressure determined by the pressure sensor; and
    wherein in response to the at least one ventilator directing the heated fluid such that the heated fluid combines with the cooled fluid into the mixed fluid, the pressure sensor detects a pressure increase in the pressurized plenum and the fluid flow control adjusts the flow rate of the fluid passing through the additional cooling fluid supply unit to reduce the pressure in the pressurized plenum.

8. The system of claim 1, further comprising:
    an additional IHS rack configured to receive the cooled fluid from the pressurized plenum, wherein the additional IHS rack includes at least one ventilator that is operable to cause the cooled fluid to be drawn from the pressurized plenum into the additional IHS rack, and wherein the additional IHS rack includes at least one ventilator that is operable to direct a heated fluid that has been heated through the additional IHS rack such that the heated fluid is combined with the cooled fluid into a mixed fluid and the mixed fluid is directed into at least one rack unit housed in the additional IHS rack; and
    wherein in response to the at least one ventilator directing the heated fluid such that the heated fluid combines with the cooled fluid into the mixed fluid, the pressure sensor detects a pressure increase in the pressurized plenum and the fluid flow control adjusts the flow rate of the fluid passing through the cooling fluid supply unit to reduce the pressure in the pressurized plenum.

9. A method for cooling an information handling center, comprising:
    providing a cooling fluid supply unit coupled to an information handling system (IHS) rack by a pressurized plenum;
    pressurizing the pressurized plenum with a cooled fluid by cooling a fluid passing through the cooling fluid supply unit and directing the cooled fluid into the pressurized plenum using the cooling fluid supply unit;
    drawing the cooled fluid from the pressurized plenum into the IHS rack;
    directing a heated fluid that has been heated through the IHS rack such that the heated fluid is combined with the cooled fluid into a mixed fluid and the mixed fluid is directed into at least once rack unit housed in the IHS rack;

detecting a pressure increase in the pressurized plenum in response to directing the heated fluid such that the heated fluid is combined with the cooled fluid into a mixed fluid; and adjusting a fluid flow rate of the fluid passing through the cooling fluid supply unit in response to detecting the pressure increase in order to reduce the pressure in the pressurized plenum.

10. The method of claim 9, further comprising:

detecting a temperature of the fluid as the fluid is supplied to the cooling fluid supply unit; and adjusting the temperature of the fluid as the fluid passes through the cooling fluid supply unit in response to the detected temperature.

11. The method of claim 9, further comprising:

detecting a temperature of the cooled fluid as the cooled fluid is supplied to the pressurized plenum from the cooling fluid supply unit; and adjusting the temperature of the fluid as the fluid passes through the cooling fluid supply unit in response to the detected temperature.

12. The method of claim 9, wherein the mixing of the heated fluid and the cooled fluid into the mixed fluid reduces the amount of cooled fluid drawn from the pressurized plenum.

13. The method of claim 9, further comprising:

mixing ambient fluid drawn from outside of the IHS rack and the pressurized plenum with the cooled fluid drawn from the pressurized plenum, wherein the mixing of the ambient fluid and the cooled fluid reduces the amount of cooled fluid drawn from the pressurized plenum.

14. The method of claim 9, further comprising:

directing the cooled fluid drawn from the pressurized plenum with a connecting plenum and a front plenum such that substantially all of the cooled fluid drawn from pressurized plenum flows through the IHS rack.

\* \* \* \* \*